(12) United States Patent
Hodgson et al.

(10) Patent No.: US 9,323,873 B2
(45) Date of Patent: Apr. 26, 2016

(54) MODELLING AND SIMULATION METHOD

(75) Inventors: Steven Hodgson, Flixton (GB); Jason Sotiris Polychronopoulos, San Jose, CA (US); Christopher Jones, Radcliffe (GB); Zakwan Shaar, Heaton Mersey (GB); Muhammed Mutaher Kamal Hashmi, Chorlton-Cum-Hardy (GB); Len Theobald, Bury (GB); Wilfred Barry Hughes, Walshaw (GB)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/330,618

(22) Filed: Dec. 19, 2011

(65) Prior Publication Data
US 2012/0166171 A1 Jun. 28, 2012

Related U.S. Application Data

(62) Division of application No. 10/943,462, filed on Sep. 17, 2004, now Pat. No. 8,082,141.

(30) Foreign Application Priority Data

Sep. 20, 2003 (GB) .................................. 0322050.6

(51) Int. Cl.
*G06F 9/45* (2006.01)
*G06F 17/50* (2006.01)
*G06F 11/32* (2006.01)
(Continued)

(52) U.S. Cl.
CPC .......... *G06F 17/5022* (2013.01); *G06F 11/323* (2013.01); *G06F 8/20* (2013.01); *G06F 11/3457* (2013.01); *G06F 11/3664* (2013.01)

(58) Field of Classification Search
CPC ............ G06F 17/5009; G06F 17/5022; G06F 17/30389; G06F 8/00; G06F 8/10; G06F 11/0757; G06F 11/3604; G06F 11/362
USPC ...................................................... 703/14, 16
See application file for complete search history.

(56) References Cited

U.S. PATENT DOCUMENTS

| 5,422,833 | A | | 6/1995 | Kelem et al. |
| 5,596,714 | A | * | 1/1997 | Connell ....................... 714/38.1 |

(Continued)

FOREIGN PATENT DOCUMENTS

| EP | 1517254 A3 | 11/2005 |
| WO | WO 01/35283 | 5/2001 |

OTHER PUBLICATIONS

MicroSim PSpice & Basics—Circuit Analysis Software—User's Guide—Version 8.0, Jun. 1997.*

(Continued)

*Primary Examiner* — David Silver
(74) *Attorney, Agent, or Firm* — Klarquist Sparkman, LLP

(57) ABSTRACT

A method for simulating behavior of first and second interrelated components within a system. The method comprises modelling behavior of said first and second components using first and second functional specifications; simulating behavior of said first and second components in predetermined circumstances by instantiating at least one first entity within a hierarchy of interrelated entities; and instantiating at least one further entity in response to the or each instantiated first entity. The or each further entity is selected by a simulation system on the basis of its hierarchical relationship with the at least one first entity.

19 Claims, 18 Drawing Sheets

(51) Int. Cl.
  *G06F 11/36* (2006.01)
  *G06F 9/44* (2006.01)
  *G06F 11/34* (2006.01)

(56) References Cited

U.S. PATENT DOCUMENTS

| | | | |
|---|---|---|---|
| 5,600,789 A * | 2/1997 | Parker et al. | 714/38.11 |
| 5,832,270 A * | 11/1998 | Laffra et al. | 717/125 |
| 5,838,970 A | 11/1998 | Thomas | |
| 5,870,585 A | 2/1999 | Stapleton | |
| 5,960,186 A | 9/1999 | Jones et al. | |
| 6,135,647 A | 10/2000 | Balakrishnan et al. | |
| 6,401,230 B1 | 6/2002 | Ahanessians et al. | |
| 6,421,634 B1 | 7/2002 | Dearth et al. | |
| 6,539,522 B1 | 3/2003 | Devins et al. | |
| 6,601,024 B1 | 7/2003 | Chonnad et al. | |
| 6,625,804 B1 * | 9/2003 | Ringseth et al. | 717/114 |
| 6,631,508 B1 | 10/2003 | Williams | |
| 6,721,950 B1 * | 4/2004 | Lupu | 719/310 |
| 8,082,141 B2 | 12/2011 | Hodgson et al. | |
| 2002/0107678 A1 * | 8/2002 | Wu et al. | 703/14 |
| 2002/0154120 A1 * | 10/2002 | Cullimore et al. | 345/441 |
| 2002/0166110 A1 | 11/2002 | Powell | |
| 2002/0188914 A1 | 12/2002 | Parashkevov et al. | |
| 2003/0101331 A1 | 5/2003 | Boylan et al. | |
| 2003/0135791 A1 * | 7/2003 | Natvig | 714/38 |
| 2004/0128585 A1 * | 7/2004 | Hind et al. | 714/38 |

OTHER PUBLICATIONS

OrCAD, OrCAD PSPICE User's Guide, 1998, 436 pages.*
Burgoon, "A mixed-language simulator for concurrent engineering," *Verilog HDL Conference and VHDL International Users Forum, 1998, IVC/VIUF, Proceedings, 1998 International*, pp. 114-119, Mar. 16-19, 1998.
European Search Report in European Patent Application No. 1517254, 2 pp., Sep. 14, 2005.
European first Office action, corresponding European Patent Application No. 04255570.6, 6 pp., Aug. 14, 2009.
European Search Report, corresponding European Patent Application No. 04255570.6, Sep. 30, 2005.

\* cited by examiner

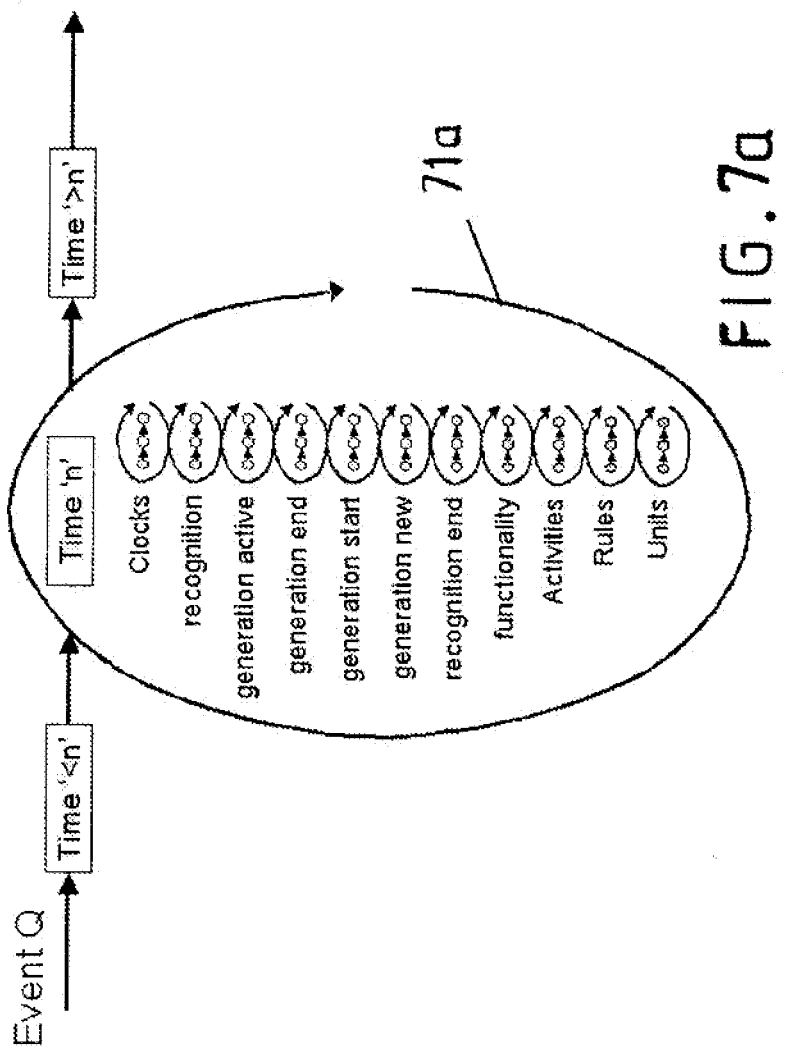

MODELLING AND SIMULATION METHOD

CROSS REFERENCE TO RELATED APPLICATION

This patent application is a divisional of U.S. patent application Ser. No. 10/943,462, filed on Sep. 17, 2004, which is hereby incorporated by reference herein.

COMPUTER PROGRAM LISTING APPENDIX

The computer program listing appendix is submitted as an ASCII text file named "Appendices_79218-01.txt," created on Oct. 3, 2011, 15.1 KB, which is incorporated by reference herein.

BACKGROUND AND SUMMARY

The present invention relates to a modelling and simulation method.

It is well known to build a model of a system and to use a simulation process to show the behaviour of that model in various circumstances. Many modelling methodologies are well known, and the methodology selected for any particular application will be determined by the requirements of that application.

It is well known to model computer hardware systems prior to fabrication. Such modelling often includes applying a simulation process to a model to ensure that the modelled system exhibits the required behaviour. Once the simulation process has determined that the modelled system exhibits the required behaviour it is known that building an implementation which is verifiably the same as the model will yield the desired results.

It is well known to consider hardware systems at varying levels of abstraction during a modelling process. For example modelling often begins with a system specification written in a natural language such as English. Hardware and performance models are then created on the basis of this system specification, and such models are often created in a high-level computer programming language, such as C++. This stage allows validation of the architectural design of the system, and evaluation of the performance of various design features. When this stage in the modelling process has yielded a design satisfying the necessary requirements, unit specifications for individual components of the system are created in a natural language. These unit specifications are in turn converted into specifications written in a hardware description language (HDL) such as VHDL which allows modelling at a lower level such as Register Transfer Level (RTL).

The system and unit specifications described above are accompanied by appropriate test code to verify the behaviour of the system and units using a simulation process.

Such testing is usually carried out at RTL. Thus, system tests can be run only when detailed RTL design has been completed for all units of the system. This is a clear disadvantage of the prior art simulation methodology described above. Furthermore, testing a complex system in its entirety when all its component units are described at RTL is likely to be very time consuming both in the creation of test data (known as a testbench) and in simulation. Random testing can be used to obviate the need to create a testbench. However, such testing requires more effort to be expended in analysing simulation results.

In an attempt to solve these problems, modelling at a behavioural level has been tried using higher level features provided by C++ and VHDL. However, two severe' problems remain. First, true system level modelling is still difficult to achieve because not enough higher level features are native to the languages. Second, behavioural level models cannot be connected to RTL models so no direct comparison can be made between the behavioural models and the RTL models and the validation of the behavioural models does not necessarily imply equivalent validation of the RTL models. Creating translators manually between the levels has proved to be a task at least as complex and error prone as creating the models themselves.

In an attempt to solve these two problems, the well known language VHDL was expanded to form a language VHDL+. VHDL+ allows the specification of a system at a much higher level of abstraction. Thus, it is possible to model behaviour at the system level instead of RTL or behavioural level, thereby saving valuable time both in the creation of suitable test data, and in the simulation process. Such modelling is described in Wilkes, D., and Hashmi, M. M. K, "Application of High Level Interface-Based design to Telecommunications System Hardware", Proceedings of the $36^{th}$ Design Automation Conference, 1999.

Some of the problems of the prior art described above arise because of the differing abstraction levels used to model hardware systems, and the difficulty of modelling differing levels of abstraction concurrently. VHDL+ attempted to solve these problems using a "interface" construct. An interface describes how data should be transferred between components at differing levels of abstraction. For example, a component of a high level model specified in VHDL+ may operate using bytes, while a model at RTL specified in VHDL may use bits. It is therefore necessary to convert a byte into (for example) a stream of eight serial bits, which, in a synchronous system, are moved between components in dependence upon a clock signal, if the high and low level components are to communicate. Such conversions can be specified within an interface construct. However, automatically generating and implementing these conversions has not been successfully carried out. Indeed, problems with the VHDL+ language have resulted in it being withdrawn from general availability, and an IEEE project to standardise the langague has been withdrawn.

Therefore, although VHDL+ sought to overcome the problems associated with simulation at high levels, and also to overcome the problems of multi-level modelling, there is no known method of automatically and accurately simulating a system when parts of that system are specified at a high level (e.g. system level) and parts are specified at a lower level (e.g. RTL).

It is an object of the present invention to obviate or mitigate one or more of the problems set out above.

According to a first aspect of the present invention, there is provided a method for simulating behaviour of first and second interrelated components within a system comprising modelling behaviour of said first and second components using first and second functional specifications, simulating behaviour of said first and second components in predetermined circumstances by instantiating at least one first entity within a hierarchy of interrelated entities, and instantiating at least one further entity in response to the or each instantiated first entity, the or each further entity being selected by a simulation system on the basis of its hierarchical relationship with the at least one first entity.

Said first and second components may be represented by respective entities in said hierarchy of interrelated entities. Instances of the respective entities may be created.

In preferred embodiments of the invention said at least one further entity is a parent of the at least one first entity in the hierarchy of interrelated entities, or a child of the at least of first entity in the hierarchy of interrelated entities.

An entity within the predetermined hierarchy may be instantiated to represent data transmitted between the first and second components. Communication between the first and second components may be modelled.

The first component may be modelled at a higher level of abstraction than the second component. Thus, the invention may allow multi-level simulation, where the term is used to include simulation of a system in which different components are modelled at different levels of abstraction.

The method may comprise providing details of the relationship between the first and second components using said predetermined hierarchy. The predetermined hierarchy of entities may be deduced from the first and second functional specifications.

The first and second functional specifications may be specified as a computer program written in a computer programming language. The method may comprise specifying relationships between said first and second functional specifications in the computer program The method may also comprise processing said computer program to generate a further computer program. Said processing may translate said computer program from a first programming language to a second programming language. The second programming language may suitably be is C or C++.

Said processing may generate a recognition algorithm to instantiate at least one entity at a higher hierarchical level on the basis of at least one entity at a lower hierarchical level. Said processing may additionally or alternatively generate a generation algorithm to instantiate at least one entity at a lower hierarchical level on the basis of an entity at a higher hierarchical level. In preferred embodiments of the invention, said processing generates said generation algorithm and said recognition algorithm from a single block of computer program code.

The invention also provides a data carrier carrying computer readable program code means to cause a computer to execute procedure in accordance with the method set out above. The data carrier may be a volatile or non-volatile computer storage device.

Graphical user interfaces are a well known method of displaying information to a user of a computer system. Many simulation systems are available which make use of user interfaces such as graphical user interfaces to display to a user the results of a simulation. Traditionally, user interfaces operate using conventional means such as call back functions to update the display. In such conventional systems, the user interface is effectively "bolted on" to the simulation system.

It is an object of the present invention to provide an alternative means for providing a user interface to a simulation system.

According to a second aspect of the present invention, there is provided a method for modelling and simulating a system using an event based simulation system, comprising storing a plurality of models each representing a component of the system, storing status information for each model, generating a plurality of events affecting the status of at least one model, simulating behaviour of the system by processing said events, and outputting data from said simulation to a user by means of a user interface, wherein the user interface is modelled by the simulation system as a further component of the system, and said user interface is updated by processing said events.

Each model may comprise a sensitivity list containing a plurality of events, and the method may comprise updating the status associated with a model in response to an event contained in its sensitivity list. At least one event in the sensitivity list of the user interface may represent updating of another model. The user interface is preferably a graphical user interface. The invention also provides a data carrier carrying computer readable program code means to cause a computer to execute procedure in accordance with the method set out above.

Event based simulation systems are well known. In such simulation systems, an event list is stored in time order, and at a predetermined time all events occurring at that time are processed. The processing of events typically results in the updating of various objects within the simulated system.

Many event based simulation systems use a so called "time wheel" structure in which each time has associated with it a data structure containing all events occurring at that time. When that time occurs, the simulation system processes all events within the respective data structure in order to effect simulation.

It is an object of the present invention to provide an enhanced event management system for use in an event based simulation system.

According to a third aspect of the present invention there is provided a method for processing events in an event based simulation system in which each event has associated with it a time and a category, wherein a data structure is established containing details of all events occurring at a predetermined time, said data structure includes details of a plurality of sub data structures, each of said sub-data structures containing details of events having a respective category and occurring at the predetermined time, and the method comprises, processing each sub-data structure in a predetermined order, said processing comprising, for each sub-data structure, processing each event in the sub-data structure, and traversing the sub-data structure until no events exist which have associated with them the predetermined time and the respective category, and traversing said data structure until no events exist which have associated with them the predetermined time.

The data structure is preferably a cyclical data structure. The data structure may be a circular linked list. Each element of the data structure may contain a pointer to a sub-data structure containing events having associated with them a respective category. Each sub-data structure may be an array or a linked-list.

BRIEF DESCRIPTION OF THE DRAWINGS

Embodiments of the present invention will now be described, by way of example, with reference to the accompanying drawings and appendices, which:

FIG. 7a is a schematic illustration of the datastructure of FIG. 7 in use;

DETAILED DESCRIPTION

Appendix 1 and Appendix 2 show CY source code for illustrative examples of the invention; and Appendix 3 shows C++ code created from the CY source code of Appendix 1.

Figure 1:
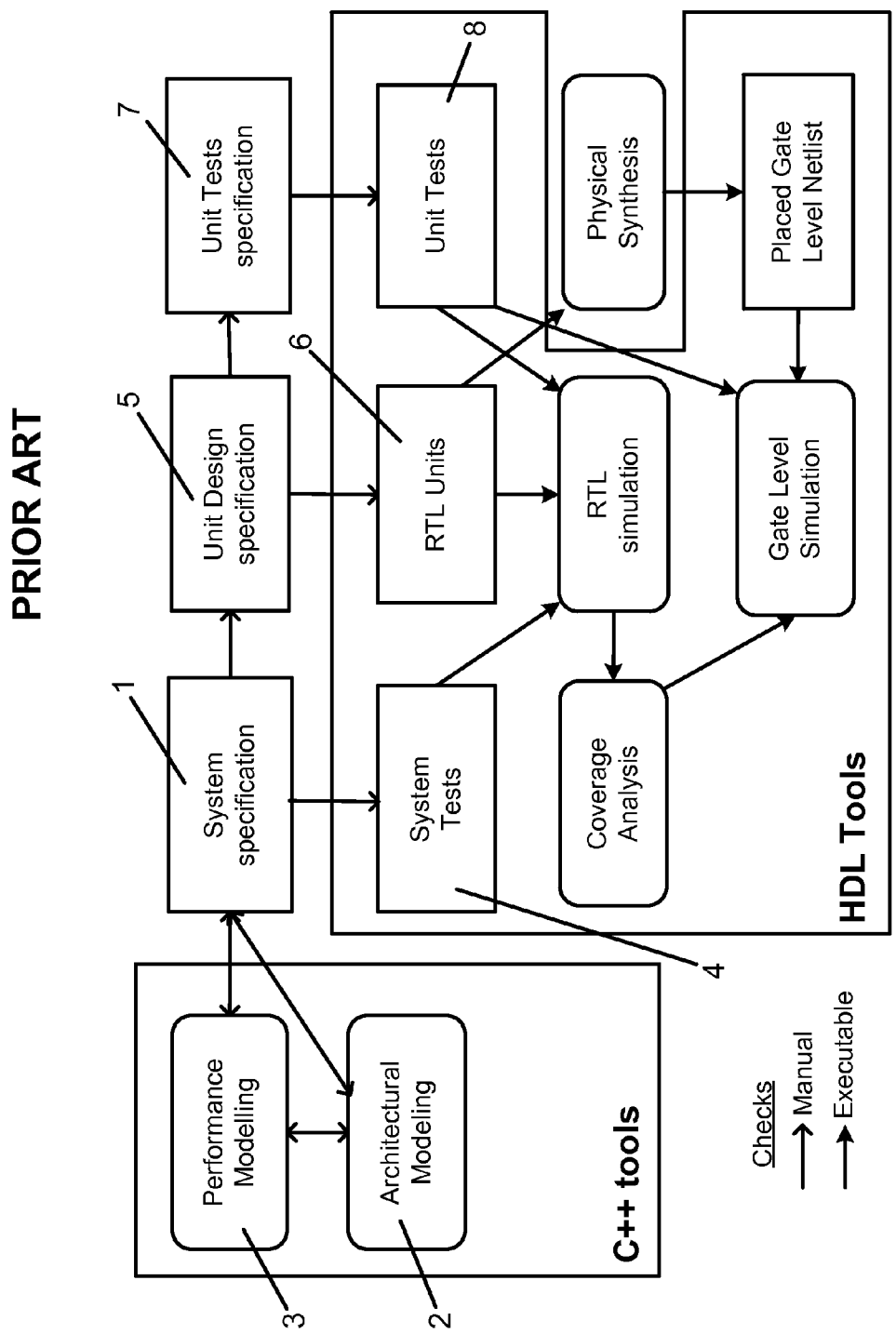
FIG. 1 is a schematic illustration of a prior art modelling and simulation process.

Referring to FIG. 1, there is illustrated a modelling process known from the prior art. Initially a system specification 1 is created in a natural language such as English. Architectural modelling 2 and performance modelling 3 are carried out using a high level programming language such as C++. During this modelling phase the system specification 1 may be amended in the light of results obtained from the modelling process 2, 3. When the system specification 1 has been finalised system tests 4 are created from the specification 1. Such tests are usually specified at Register Transfer Level (RTL) so that they can be run on the full System Model. A Unit design specification 5 is also created from the system specification 1. This specification details of units which are to make up the system and is again written in a natural language, although units are sometimes modelled behaviourally as well. The unit design specification 5 is in turn used to create RTL unit models 6. The unit design specification 5 also forms a basis for a unit test specification 7, which in turn create unit tests 8, again at RTL.

The translation of the model between the forms described above and the creation of appropriate test specifications and tests is all carried out manually. Once these manual processes have been completed, all necessary components are specified at RTL and automated Hardware Description Language (HDL) tools can be used to perform appropriate modelling and simulation, as illustrated in FIG. 1.

The problems with the prior art are illustrated in FIG. 1 by the large number of translation steps which must be performed manually. This increases the modelling time and also increases the possibility of errors being introduced. Furthermore, FIG. 1 also shows that true system simulation can occur only at RTL, which means that the system can not be simulated until the entire system has been specified to this relatively low level of abstraction. Any behavioural models cannot be expected to be a true representation of the system as there is no automatic connection between the different levels.

Figure 2:
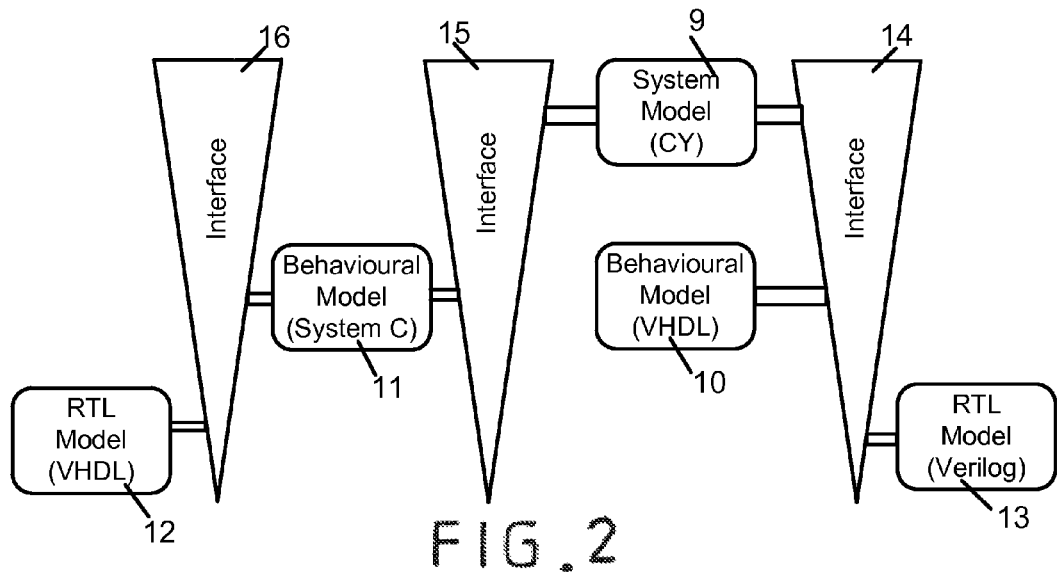
FIG. 2 is a schematic illustration of a model which may be simulated in accordance with the present invention.

FIG. 2 shows a modelling process in accordance with the present invention, in which different system components are specified at different levels of abstraction. A system model 9 is specified at a relatively high level in a novel programming language CY. Although embodiments of the invention described here employ this language it will be readily apparent to those skilled in the art that alternative programming languages may be used in a similar manner. Other components of the system are specified at lower levels of abstraction. For example two components are represented by behavioural models 10, 11 which are respectively specified in the HDLs SystemC and VHDL. Similarly two further components 12, 13 are specified at RTL using VHDL and Verilog. It will again be appreciated that each of the specified programming languages may be replaced with an alternative programming language.

FIG. 2 therefore contains a number of models at different levels of abstraction. In accordance with the present invention these models are simulated concurrently. Interactions between the models are defined by interfaces 14, 15, 16 which are again specified in the novel language CY.

Figure 3:
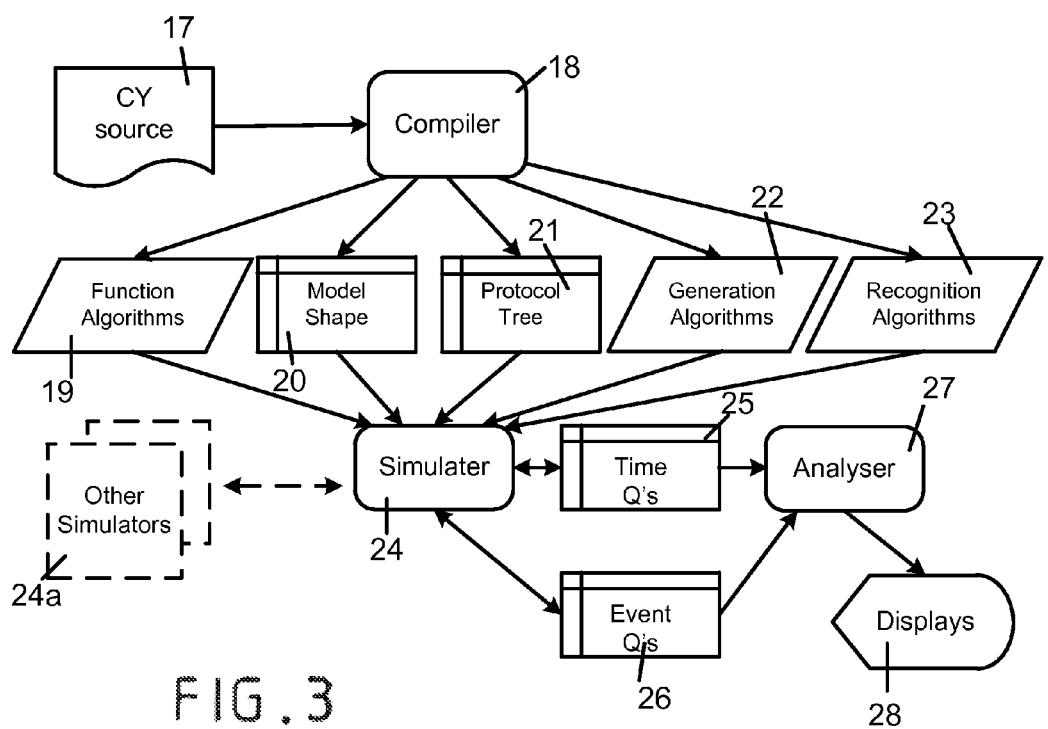
FIG. 3 is a schematic illustration showing a modelling and simulation process in accordance with the present invention.

Referring to FIG. 3, there is illustrated the process of compilation of a multilevel model specified in CY into a form in which it can be simulated. A model specification 17 is created in the programming language CY. This specification is passed through a compiler 18 which converts CY source code into C++ code. The created C++ code essentially comprises five components. A first component 19 comprises function algorithms for components within the modelled system. A second component 20 defines the shape of the modelled system in terms of modelled components and their relationships. A third component 21 is a protocol tree which specifies the relationships between objects at different levels of abstraction. A fourth component output from the compiler 18 comprises generation algorithms 22 which are used to generate relatively low level data from relatively high level data. A fifth component 23 comprises recognition algorithms which are used to recognise high level data from one or more items of low level data. Each of these components is described in further detail below.

The output C++ code containing the components identified above is input to a simulator 24 which is configured to accept C++ code. The simulator also has as an input test data (not shown) which can be specified in CY and compiled to generate appropriate C++ code. The test data is applied to the model in order to perform simulation. During the simulation process Time-Qs 25 are used to store state information related to model components. Event-Qs 26 are used to store events which are processed during an event based simulation process.

The data from the Time-Qs 25 and Event-Qs 26 is analysed by an analyser 27, and output from the analyser is passed to a display 28 which displays simulation results to a user.

The simulation process described above can be used to model a system comprising components modelled at varying levels of abstraction, assuming that all components are modelled using the common language CY, which in turn is compiled to generate C++ code. It is desirable to allow components at different levels of abstraction to be specified in different languages, as shown in FIG. 2. Therefore, CY provides a construct which allows a user to specify a CY header for a component, together with details of a model in a different language (e.g. VHDL). In such circumstances, the simulator encounters such a construct, and invokes an appropriate (e.g. VHDL) simulator 24a. It will be appreciated that a plurality of other simulators 24a may be provided, each simulating on the basis of code in a different language, as illustrated in FIG. 3.

Figure 4:
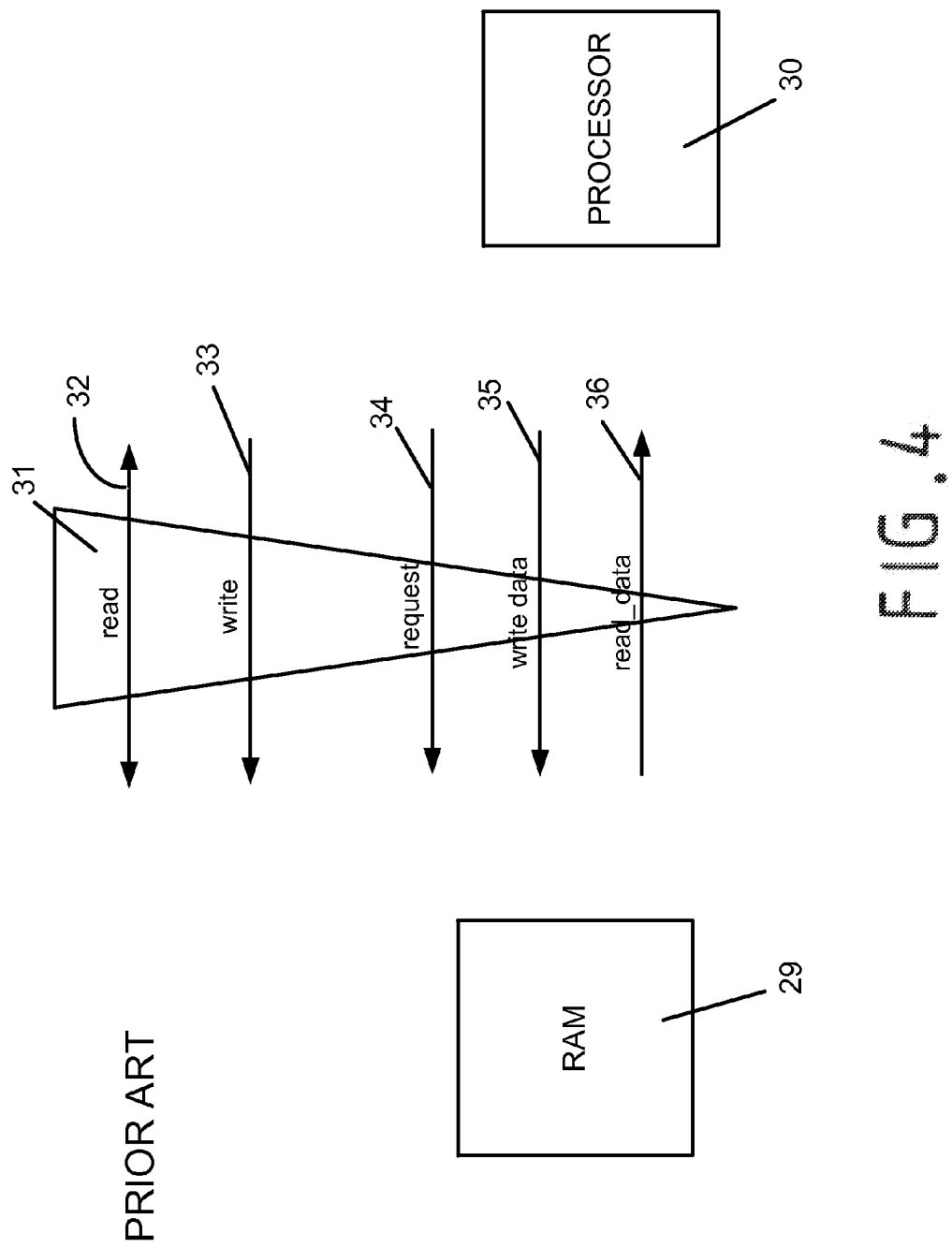
FIG. 4 is a schematic illustration of an example system which is modelled and simulated in accordance with the present invention.

Specification of the components output from the compiler in terms of their CY source code will now be described with reference to a simple example which will be referred to throughout the description. CY source code for this example is set out in Appendix 1. A schematic illustration of the system to be modelled is shown in FIG. 4.

The system comprises a block of RAM 29 and a processor 30. An interface 31 is provided between the RAM 29 and the processor 30. A read operation 32 is modelled in which an address is provided by the processor 30 the block of RAM 29, in response to which data is provided to the processor 30. A write operation 33 is modelled in which data and an address are provided by the processor 30 to the block of RAM 29, and the data is written to the specified address within the RAM 29.

These read and write operations are provided using three lower level communications as follows: a request message 34 in which an address is provided by the processor 30 to the RAM 29 together with a read/write flag, a write data message 35 in which the processor 30 provides data to be written to a previously specified address in the RAM 29, and a read data message 36 in which the RAM 29 provides data from a previously provided address to the processor 30.

Appendix 1 shows the CY source code for the interface 31. The interface is defined at line 1 as being between a processor unit and a ram unit. Lines 4 and 5 specify constants used within the interface, and line 7 specifies a clock signal that repeatedly has a value '0' for 5 ns followed by a value '1' for 5 ns.

An 'always' block is defined at lines 9 to 13. this specifies that the interface accepts read and write objects. Use of the '_' character as parameters of these functions indicates that read objects and write objects with any parameters are accepted by the interface.

A read object is defined as a transaction, as shown at lines 15 to 27. A transaction in CY is a bi-directional communication. Line 21 states that the communication is between processor and RAM. It can be seen (lines 17 and 18) that the read transaction has two parameters, a thirty two bit address which is passed from the processor to the RAM and a thirty two bit data word which is passed from the RAM to the processor.

A seq block is specified at lines 22 to 26. This indicates that the read transaction comprises two sequential statements a request communication from the processor to the RAM and a read_data communication from the RAM to the processor. That is, a read transaction involves the processor requesting data from a specific address, and the RAM returning data from that address. The request and read_data objects are defined within the interface. Further features of the interface are described below.

Referring back to FIG. 3, the generation algorithms 22 derived from the CY source code will be described with reference to Appendix 1. The seq block within the read transaction specifies a request stripe taking as its parameters the address passed to the transaction as a parameter, and a constant parameter '1' (this constant is a flag, and is used such that '1' indicates a read and '0' indicates a write), and a read_data stripe. Thus, when a read transaction is generated, it can be deduced that lower level request and read_data stripes must be generated. That is, the seq block provides the code which creates the generation algorithm.

Similarly, if a request stripe is identified followed by a read_data stripe, these can be combined into a read transaction. This is the purpose of the recognition algorithm 23. Thus, the seq block within the read transaction forms the basis for both the generation algorithm 22 and the recognition algorithm 23. It is advantageous to specify both algorithms is a single code block, as this means that there is no need to prove that the algorithms are equivalently specified.

Referring to FIG. 3, the other components generated by the compiler 18 will be described in further detail. Function algorithms 19 define functionality of models within the modelled system. This functionality can either be specified in the CY source code, or alternatively the CY source code may simply provide a header indicating where the functionality is to be found (e.g. a VHDL file).

The model shape 20 is concerned with the relationship between components within the modelled system. That is, which components communicate with which other components and by means of which interfaces. This can be deduced from the CY source code by the compiler 18.

Figure 5:
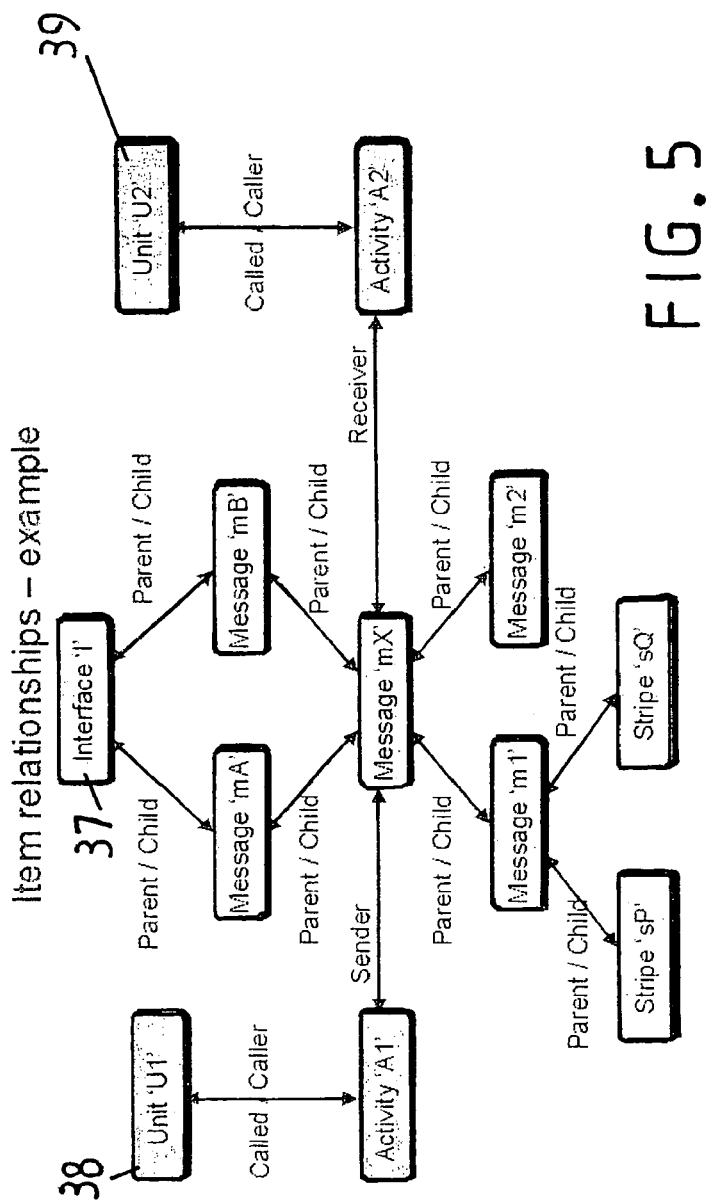
FIG. 5 is a tree diagram showing relationships between communication items in the system of FIG. 4.

The protocol tree 21 is concerned with the manner in which objects at different levels of abstraction are related to one another. A tree diagram including relationships specified in the protocol tree is illustrated in FIG. 5. The tree of FIG. 5 represents the scenario described by the CY source code of Appendix 2.

Appendix 2 shows source code for an interface I between two units U1, U2, and source code for the units UI and U2 themselves. The interface I is specified as handling messages mA and mB (lines 4 to 8). Messages within CY are unidirectional communications.

Lines 10 to 18 define the message mA. It can be seen that the message is passed from U1 to U2, and that transmission takes 10 ns. The seq block (lines 14 to 17) states that the message mA comprises a single message mX. That is, the message mA has as its child the message mX.

Lines 30 to 39 define the message mX. It can be seen that this message is again passed from unit U1 to unit U2, and has a duration of 10 ns. Message mX comprises two sequential messages m1 and m2 (lines 34 to 38). Messages m1 and m2 are defined at lines 41 to 50 and 52 to 56 respectively.

Message m2 comprises no sub-components. That is the message m2 has no children. The message m1 has two sequential sub-components sP and sQ. Each of these is a stripe which is defined within the interface. The stripes have no sub-components.

FIG. 5 is a tree diagram illustrating the relationships described above. It can be seen that the interface I 37 is shown as having two children, the messages mA and mB. Each of the messages mA and mB are shown to have as a child the message mX. Message mX has two children m1 and m2. m1 in turn has stripes sP and sQ as its children.

Referring back to Appendix 2, It can be seen that a unit U1 is defined at lines 73 to 88. The seq block of lines 83 to 86 specifies the behaviour of the unit. In this case this behaviour is simply specified in terms of a call to activity A1 which in sends a message of type mX across interface I. Unit U2 is defined at lines 90 to 105. Here, it can be seen that activity is defined by an activity block A2 which receives a message mX. Thus, U1 acts as a sender and U2 acts as a receiver.

Units U1 38 and U2 39 are again illustrated in FIG. 5. It can be seen that Unit U1 calls Activity A1 which in turn sends a message mX. Similarly Unit U2 calls an activity A2 which receives a message mX.

In use, the source code of Appendix 2 is compiled to create generation algorithms and recognition algorithms using the activities provided in the interface. Function algorithms are created from the definitions provided within the unit specifications, and model shape can be deduced from the CY code. A protocol tree is created as described above. Simulation of the system on the basis of the components output from the compiler is now described.

Figure 6:
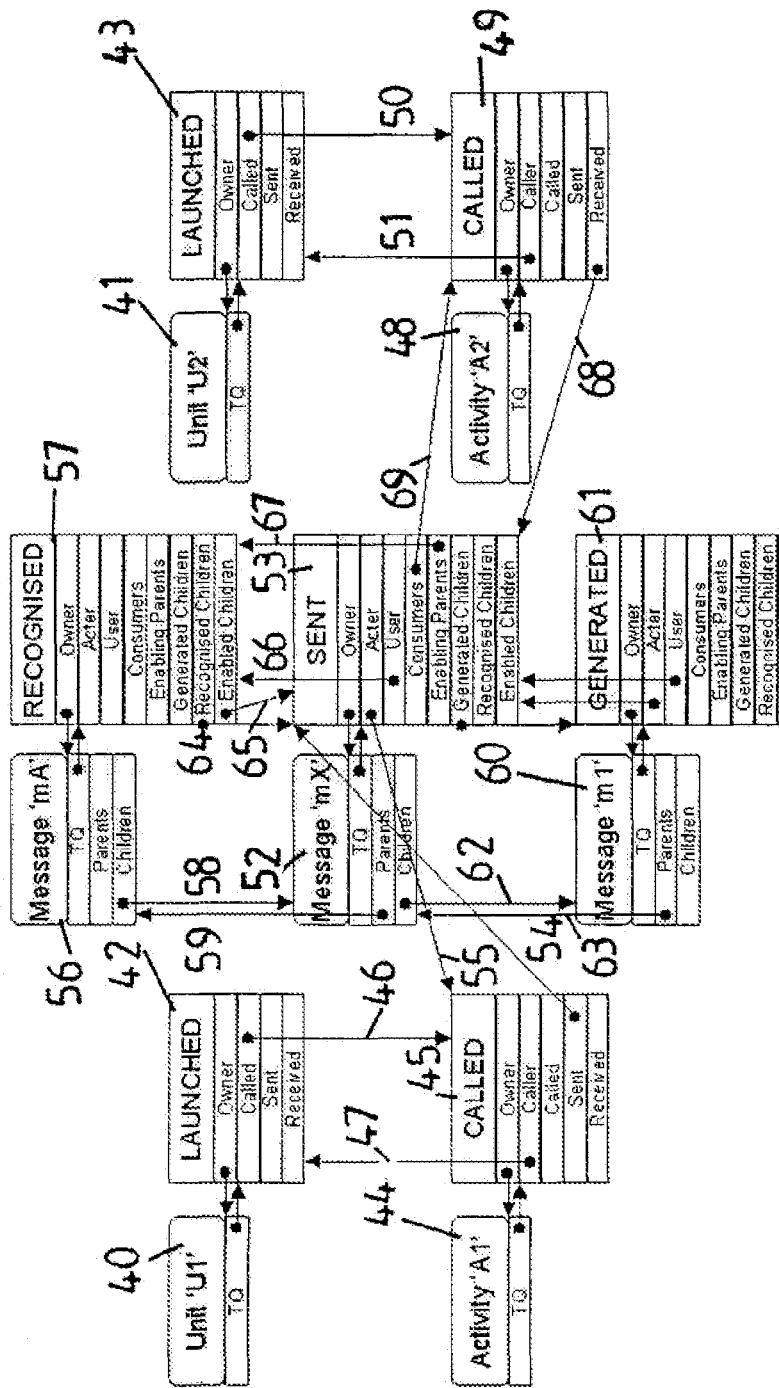
FIG. 6 is a set of Time-Q Entries relating to the example of FIGS. 4 and 5.

During simulation the state of the simulated model must be stored. This is achieved using a Time-Q. FIG. 6 illustrates a set of Time-Q entries for the model of FIG. 5 and Appendix 2. It can be seen that each of the entities shown in FIG. 5 is represented by an entry in the time-Q. Each TimeQ Entry represents an activation, or possible activation, of that entity, so that over time an entity may have many TimeQ Entries. Alternatively, if an entity has concurrent activity, it may have two entries at a single time. The relationships between the entities are also illustrated.

Relationships illustrated by the TimeQ of FIG. 6 can be categorised as functional relationships and interface relationships. There are essentially four functional relationships. A "caller" is the initiator of an item. "Called" indicates a list of functional items which have been called by this item. "Sent" provides a list of interface items which have been sent by the items. "Received" provides a list of interface items that have been received by this item.

Interface relationships include "acter" which is the initiator of the item. "Consumers" are functional items which have received this item. "Enabling parents" is a list of higher level interface items that enable the existence of this item. "Enabled children" is a list of lower level interface items that this item has allowed to exist. "Recognised children" is a list of lower level interface items that this item has recognised as being legal. "Generated children" is a list of lower level interface items that this item has generated and therefore are known to be legal.

The TimeQ is updated as simulation progresses, each Time-Q entry stores its creation time and is used to store past present and future states. Possible future states may be stored in the Time-Q and removed when they become impossible. In some circumstances it is preferable to retain all such states for debugging purposes. Completed TimeQ Entries are usually kept but may optionally be removed from the TimeQ.

Use of the TimeQ during simulation is now described with reference to FIG. 6. At the start of simulation, a TimeQ entry 40 is created to represent unit U1. A similar TimeQ entry 41 is created to represent unit U2. The TimeQ entry 40 representing the unit U1 has associated with it status information 42 representing the status of that TimeQ entry. Similarly, TimeQ entry 41 representing the unit U2 has associated with it appropriate status information 43. It can be seen that the blocks of status information 42, 43 are both marked "launched" to show that each of the units is active. The "owner" field present in both blocks of status information 42, 43 is linked to the representation of the unit.

As shown in Appendix 2, the first action of unit U1 is to call activity A1. Therefore, an appropriate TimeQ entry 44 is created to represent activity A1 and appropriate status information 45 is also stored. A link 46 is created between unit U1 and activity A1. The link emanates from the "called" field of unit U1. The status of activity A1 is shown as "called". In addition to the link 46, a link 47 is also created so as to identify the "caller" as unit U1.

Similarly, the unit U2 calls activity A2 and an appropriate TimeQ entry 48 is also created. Status information 49 for the TimeQ entry 48 is also stored. Again, a link 50 identifies that unit U2 called activity A2, and a link 51 identifies that unit U2 is the caller of activity A2.

The first action of activity A1 is to send a message mX. An appropriate TimeQ entry 52 is created for message mX. Status information 53 is stored alongside the TimeQ entry 52. This status information indicates that message mX was sent. A link 54 indicates that activity A1 is the sender of mX. A link 55 indicates that the message mX was sent by activity A1. From appendix 2 it can be seen that message mX is a child of message mA. Therefore, for message mX to exist, an instance of message mA must exist. The simulation system therefore automatically creates an instance of message mA and an appropriate TimeQ entry 56 is created. The status information 57 is stored alongside TimeQ entry 56. A link 58 identifies message mX as a child of message mA. A link 59 identifies message mA as a parent of child mX. Initially, the status of message mA is shown as "enabler" (not shown in FIG. 6).

Additionally, the simulation system also triggers the creation of instances of the children of message mX. Therefore, an appropriate TimeQ entry 60 is created for message m1 together with appropriate status information 61. Links 62, 63 identify the parent/child relationship between message mX and message m1. Given that TimeQ entry 60 representing message m1 has been generated by message mX, the status information 61 shows that message m1 as "generated". Given that message mA comprises only a single instance of message mX (see lines 10 to 18 of appendix 2) the sending of message mX by activity A1 results in the creation of a complete instance of message mA. This is recognised by the simulation system, and status information 57 therefore indicates that message mA is "recognised".

This is as shows in FIG. 6. Referring to status information 57, it can be seen that a link 64 indicates that message mX is a recognised child of message mA, and a link 65 indicates that message mX is enabled by message mA. Similarly a link 66 indicates that message mX is a user of message mA and a link 67 indicates that message mX is enabled by message mA. Similar relationships are created between the TimeQ entry 52 for message mX and the TimeQ entry 60 for message m1 as shown in the status information 53, 61.

Referring again to the TimeQ entry 48 representing activity A2, it can be seen from Appendix 2 that activity A2 simply waits to receive an instance of message mX. When the TimeQ entry 52 is created representing a message mX sent by activity A1, this can be received by activity A2. A link 68 denotes this receiving. Similarly, a link 69 indicates that activity A2 is a consumer of message mX. Thus, the TimeQ shows the transfer of a message mX 52 between an activity A1 44 and an activity A2 48.

In the example described above, message mX is sent by activity A1 and received by activity A2. Thus both activities A1 and A2 send and receive messages at the same level of abstraction. However, the ability of the simulation system of the present invention to create instances of the children and parents of message mX (messages mA and m1 represented by TimeQ entries 56, 60) allows, for example, an activity to receive message mA in response to the sending of message mX by activity A1. Similarly, an activity can receive a message m1 in response to the creation of message mX by activity A1. Thus, a message sent at one level of abstraction can be received at another lower or higher level. It will be appreciated that in many examples a more complex hierarchy or messages will be used. For example, a series of messages at a lower level (e.g. bits) may be recognised together as forming a single message of a higher level (e.g. 8 bits being recognised as a byte or 32 bits being recognised as a word). The general principals of the present invention as described with reference to FIG. 6 are generally applicable to such cases, and the invention allows data interchange at different levels of abstraction.

When all uses of TimeQ entries 52, 56 and 63 are complete they may be deleted unless required for debug purposes. Before a TimeQ entry is deleted all links emanating from it are used to remove all links pointing to it.

Creation and deletion of TimeQ entries or changes to state of TimeQ entries is controlled using an Event Queue mechanism which ensures correct processing order of TimeQs across functional elements as well as across, up and down interface elements (see below).

The simulator illustrated in FIG. 3 operates as an event based simulator. In common with other event based simulation systems, events are stored in an event queue. In a conventional event-based simulation system, events are grouped together by the time at which they occur. This is usually achieved by providing a circular linked list in which each element of the list represents a specific time, and provides a pointer to events occurring at that time. Each element in the linked list may have a form described by the following C struct:

```
struct ListElement
{
    Event* Events;
    ListElement* Next;
}
```

'Events' is a pointer to a data structure comprising all events occurring at a time associated with that element. 'Next' is a pointer to the next element in the list. Given that the list is a circular linked list, the 'Next' field of the tail element of the list points back to the head of the list.

Initially the linked list, comprising n elements, represents events at time 0, 1, . . . , n. When time 0 has passed, there is no requirement for the simulator to maintain a representation of events occurring at that time, and accordingly the head element of the list is represents events occurring at time n+1, such that the linked list now represents events at times n+1, 1, . . . , n. When time 1 has passed, the list then represents events at times n+1, n+2, 2, . . . , n, and so on.

In a conventional system Event * points to a data structure storing all events occurring at a specific time in an arbitrary order. This data structure can conveniently be implemented using a further linked list, although it will be apparent that other data structures may be used.

Figure 7:
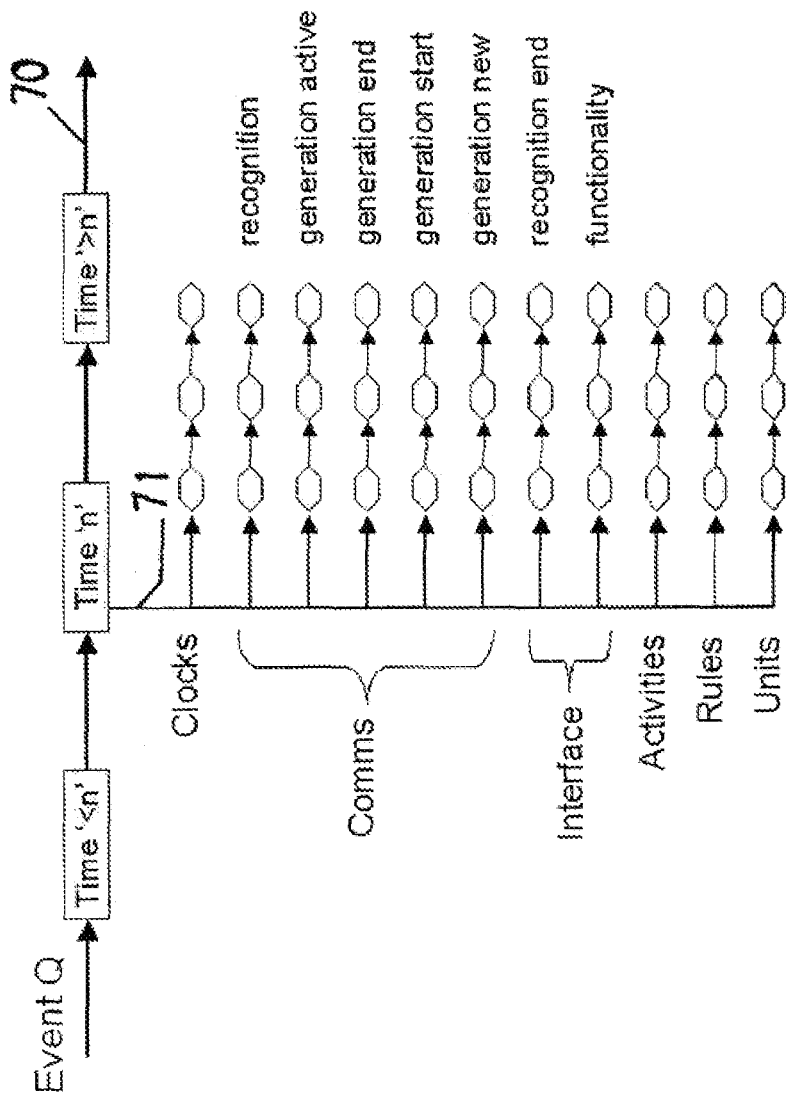
FIG. 7 is a schematic illustration of a datastructure implementing the Event-Q used by FIG. 3.

FIG. 7 illustrates the event queue used in the simulation system of the present invention. For each time interval an entry is provided in a linked list 70. Each entry provides a pointer 71 to events occurring at that time. As can be seen from FIG. 7 the events are grouped into categories and sub-categories. The categories are clock events, comms events, interface events, activity events, rule events, and unit events.

The comms events and interface events are both further categorised into sub-categories as shown in FIG. 7.

FIG. 7a schematically illustrates the order in which events within the event queue are processed for a given time period. At given time, the datastructure holding clock events is traversed repeatedly until it contains no further events. When the datastructure holding clock events is empty, the datastructure holding recognition events is then traversed until it is empty. This process continues with each other category of events in turn. When each of the datastructures holding events of a particularly category have been traversed, they are traversed again (as denoted by line 71a), to determine whether further events have been created for that time period. This process continues until all datastructures holding events occurring at a particular time are empty.

The event processing algorithm described above can be considered to be two nested 'wheels' within a conventional time wheel structure. The order in which events occurring at a particular time are processed is important. For example, all recognition events must be processed before generation events.

In a traditional 'time-slot' event simulator even times with no events have an list entry. In the event queue proposed by the present invention, if there are no events for a particular time, there will be no entry in the linked list 70. This is advantageous for the performance of a system simulation since events are often irregularly and sparsely distributed. In addition, in simulation above RTL, processing events at any time can cause events for any time in the future. For example the processing of events at time '1' could result in a list with events for n+1, n+3, n+7, 2, . . . , n.

As shown in FIGS. 5 and 6, the described embodiment of present invention operates using a hierarchical set of entities to enable multi-level simulation. The event mechanism described above, which categorises events relative to their function within the hierarchy (e.g. recognition event, generation event, unit event) enables processing to be carried out in an efficient ordered manner (e.g. all interface-related events can be processed before unit-related events, all recognition-related events before generation-related events and so on). This mechanism not only provides for optimum performance, but also greatly simplifies event processing. Without such categorisation of events, each event would have to ascertain the status of other items in its hierarchy before it could safely process the event. Where an event could not be safely processed it would remain on the event list until other events had completed. With categorisation in place each event can be safely processed in the order that they have been listed.

Figure 8:
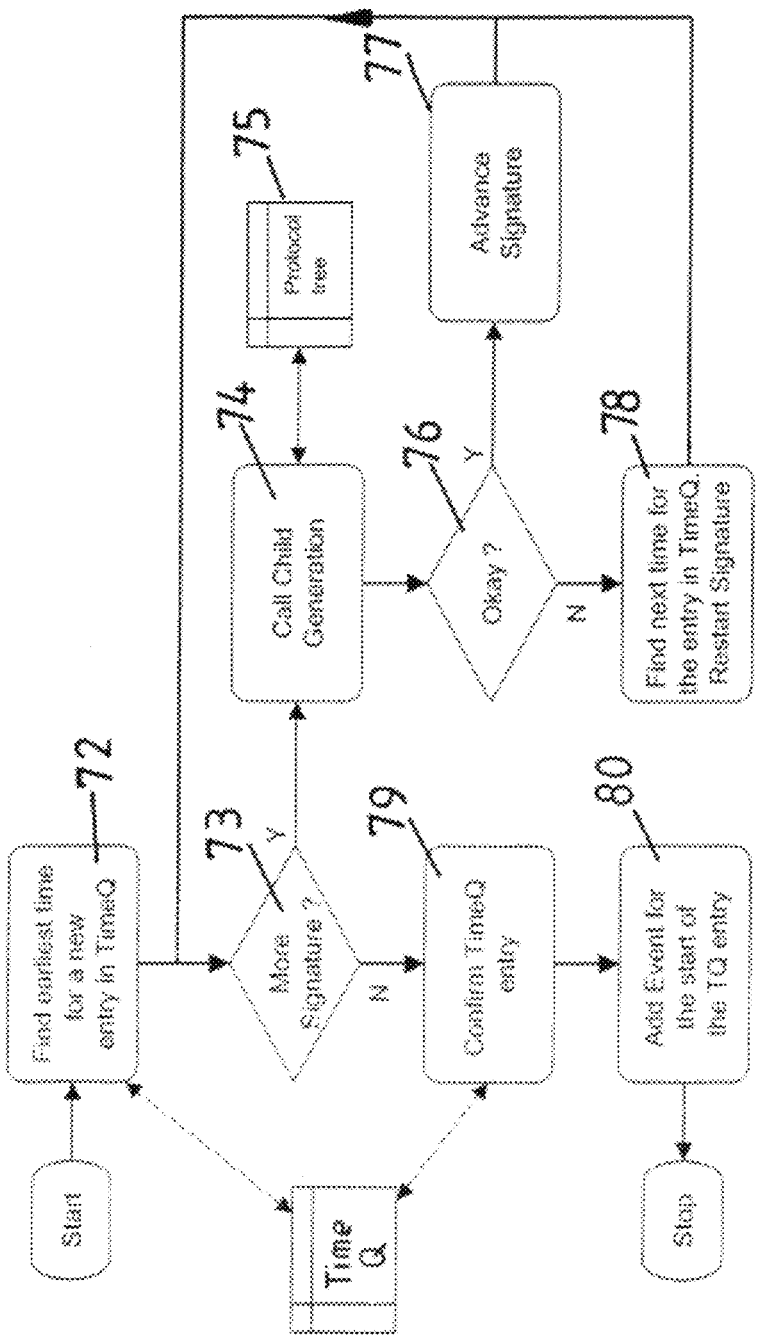
FIG. 8 is a schematic illustration showing an implementation of the generation algorithm of FIG. 3 in further detail.

Operation of the simulator in executing the algorithms created by the compiler 18 (FIG. 3) is now described. FIG. 8 is a schematic illustration of a generation algorithm. As a first step 72, the generation algorithm interrogates the Time-Q to determine an earliest time (i.e. the 'start_time') a new TimeQ entry for this interface item can be created. If it is the case that there are already entries for this interface item, then these entries must be completed before further entries for the interface item can be processed in the Time-Q, but the entry can be created immediately and scheduled to occur at its 'start_time'. The TimeQ entry is created and the 'start_time' recorded. If an entry is detected at decision block 73, that activity continues by generating children at block 74. The children to be generated are determined from the protocol tree 75. Assuming that this child generation is successful (decision block 76), the generation algorithm is advanced at block 77, and the algorithm returns to the block 73. If there is further processing this proceeds as described above. If the generation failed for any reason (block 78), the TimeQ entry is deleted, the algorithm finds the next entry in the Time-Q and the algorithm is restarted to block 73. If it is determined that there is no further signature (block 73), block 79 confirms the TimeQ entry and block 80 an appropriate event, for the 'start_time' is added to the Event-Q.

Figure 9:
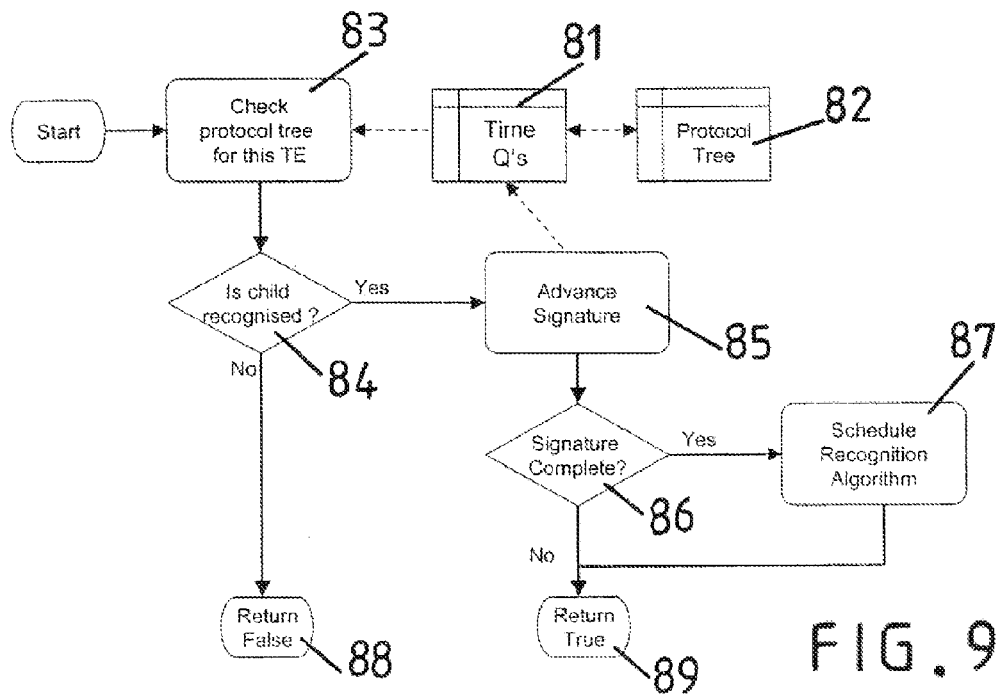
FIG. 9 is a schematic illustration showing an implementation of the recognition algorithm of FIG. 3 in further detail.

FIG. 9 illustrates the processing of a recognition algorithm. When a TimeQ entry completes (e.g. end of generation) it calls a recognition algorithm for each of its parent TimeQ entries that allowed it to exist. The parent entry in its TimeQ 81 checks its current signature within the protocol tree 82 at block 83. If the child fits into the next stage of the protocol tree (block 84) then the signature is advanced at block 85. If its (i.e. this parent's) signature is now complete (block 86) then it schedules a call for its TimeQ entry to be recognised (block 87). If the child has been recognised at block 84 then the algorithm returns false at block 88, Otherwise the algorithm returns true at block 89.

Figure 10:
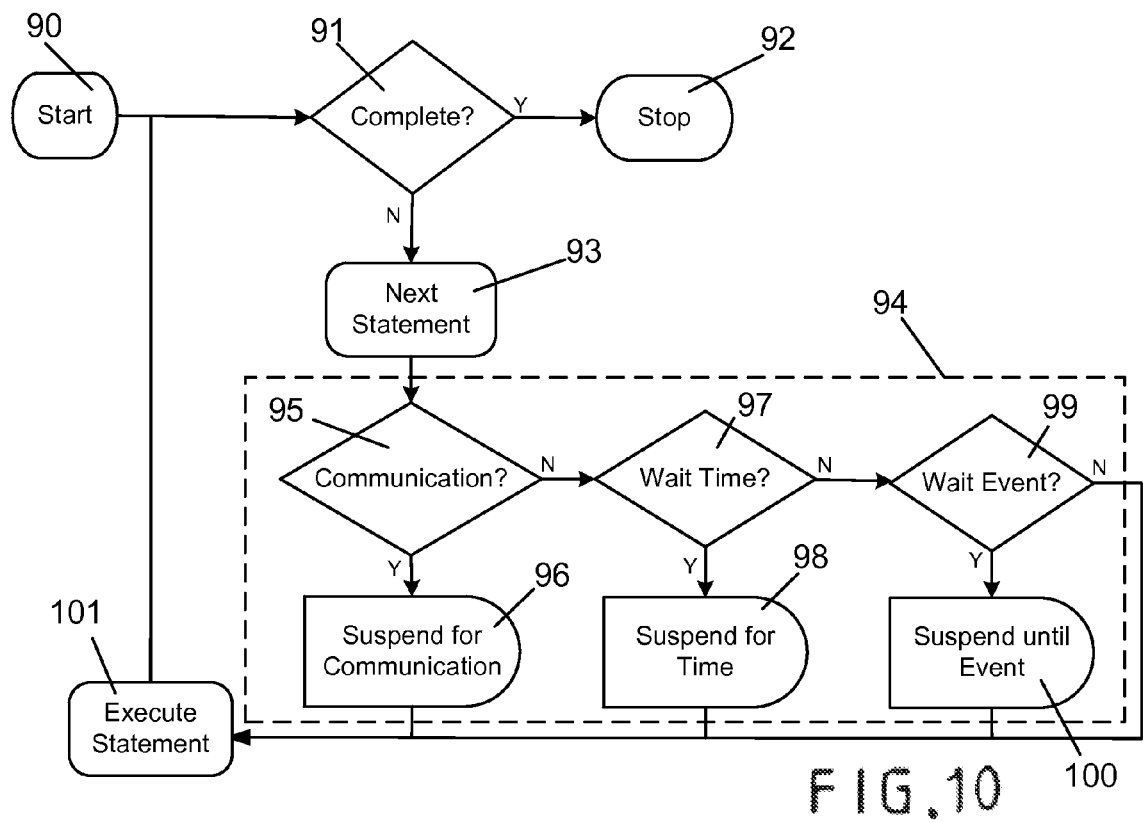
FIG. 10 is a schematic illustration showing an implementation of the function algorithm of FIG. 3 in further detail.

FIG. 10 illustrates a function algorithm. From a start block 90 a decision block 91 determines whether or not the function algorithm is complete. If the algorithm is complete, the algorithm terminates at block 92. If the algorithm is not complete, block 93 identifies the next statement. It may be that this next statement requires a pause before its execution. Such pauses are handled by a block 94. The statement identified by the block 93 is considered to determine if it is a communication event (block 95). If this is the case, a suspension block 96 is activated. Similarly, if decision block 97 determines that the event is a wait time event suspension block 98 is activated, and if decision block 99 determines that the statement is a wait event, a suspension block 100 is activated. After an appropriate suspension, or if it is the case that no suspension is appropriate, the statement is executed at a block 101, and the process is repeated.

Figure 11:
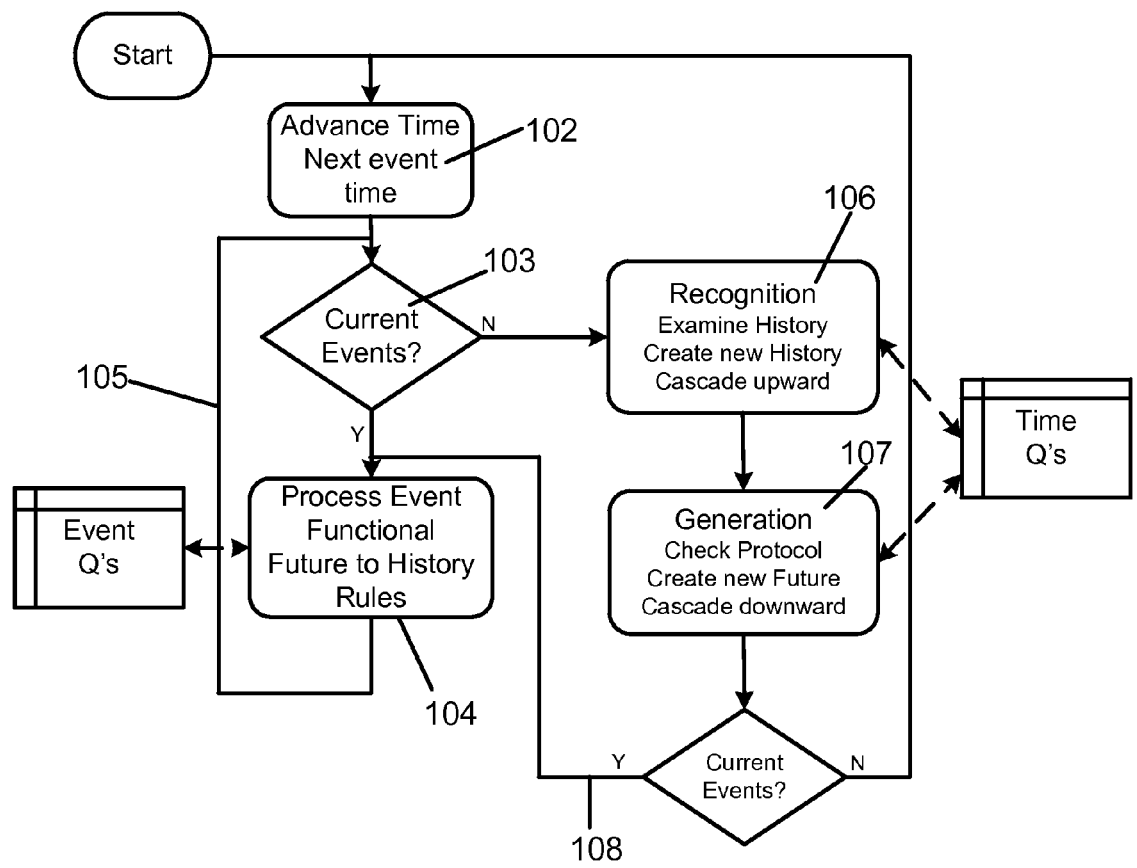
FIG. 11 is a schematic illustration showing process flow within the simulator of FIG. 3.

FIG. 11 provides a flow chart for the general operation of the simulator 18 (FIG. 3). Time is advanced to the next event time at a block 102. A check is then executed to locate events which exist for that time (block 103). If events are found, these are processed at block 104, and this process continues by means of a loop 105. If no current events are located, any recognition and generation algorithms to be executed at that time are executed (blocks 106, 107). This may generate more events for the current time, and if this is the case, these events are processed 108. If no such events exist, the simulator advances time at the block 102.

Referring back to Appendix 1, in addition to the interface which has been described above, there is provided CY source code for the RAM unit, CY source code for a test unit and CY source code for the system being modelled. The test unit is applied to the unit and interface by the simulator in the manner described above. The test code provided by the CY source code writes data to RAM, and then causes a read and write to be executed in parallel. The sequence of operations is illustrated in FIG. 12.

Figure 12:
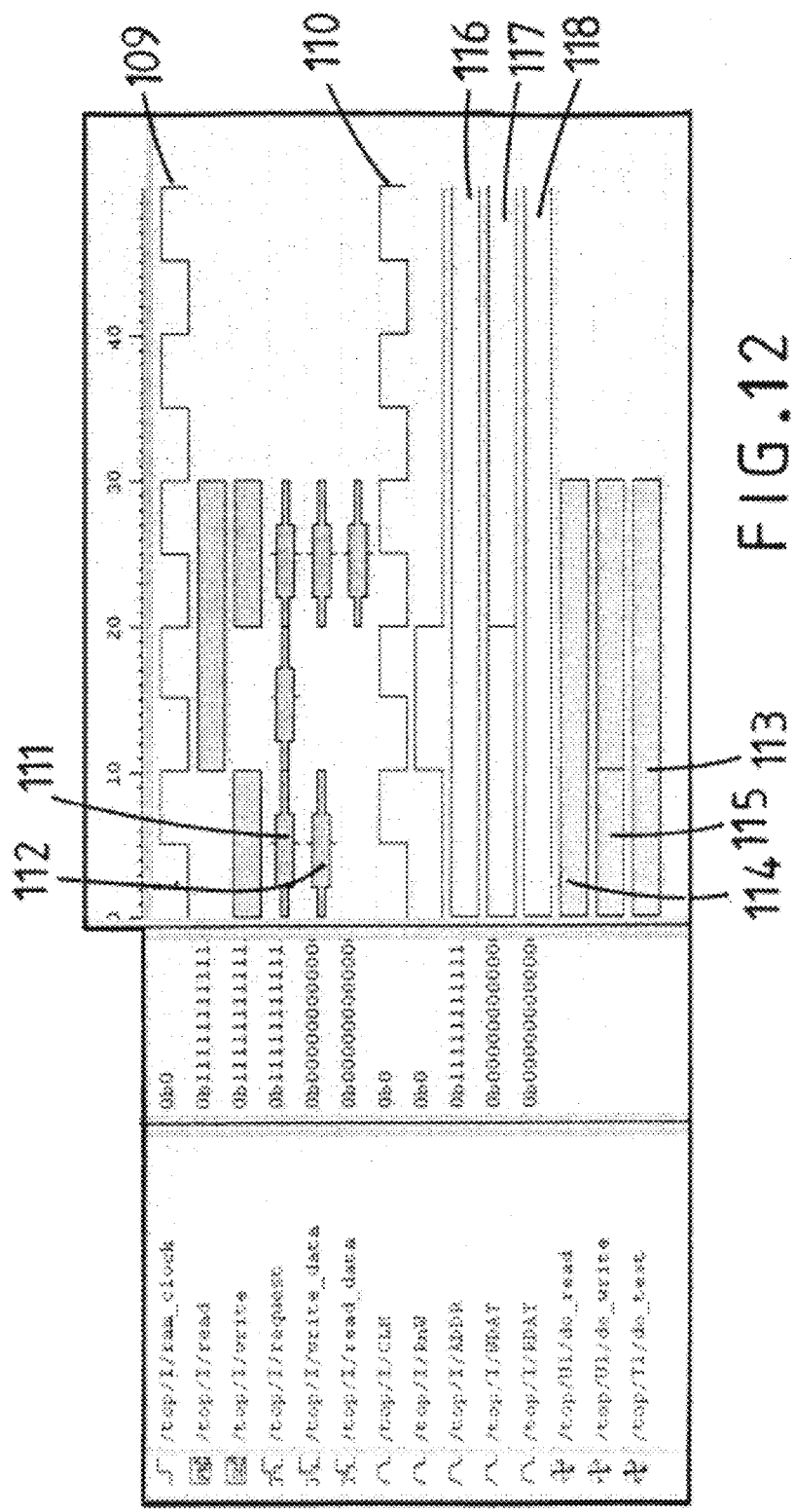
FIG. 12 is a timing diagram showing timings by displaying some parts of the TimeQ Entries within a system simulated using the method of FIG. 3.

Referring to FIG. 12 it can be seen that both ram_clock 109 and clock 110 are illustrated as being regular clock signals. Each of these clock signals has a value '0' for 5 ns, followed by a value '1' for 5 ns.

Lines 154 and 155 of Appendix 1 show that a first part of the test scenario 'proc_for_ram'—instanced and connected in the top level structure on lines 189 and 194—involves generating a request object including an address, then a write_data object to write data to that address. The request object 111 and write_data object 112 can be seen from FIG. 12. These messages are generated within the activity do_test, an instance of which 113 is created by the test scenario on line 179. Similarly, instances of do_read 114 and do_write 115 are also created on lines 134 and 135 in an 'always' block so that a new instance is activated as soon as one has completed. Similarly from the interface defined in Appendix 1 it can be seen that ADDR 116, WDAT 117, and RDAT 118, are children of the created objects, and these too are illustrated in FIG. 12.

A next block of test code (beginning at line 160 of appendix 1), specifies a read and a write in parallel (by means of a 'par' statement). The operations corresponding to this code are also illustrated in FIG. 12 from times 10 to 30.

As discussed above, CY source code is compiled by the compiler 18 to generate C++ code. Generated C++ for recognition and generation algorithms generated from the code of Appendix 1 is set out in Appendix 3.

Preferred embodiments of the present invention include a graphical user interface (GUI). A suitable form for such a GUI is now described. It is preferable to provide the GUI using a novel method provided by the invention.

In this method, each GUI display window is considered by the simulator as a 'unit instance' within the model being simulated. When an item is added to a window, the simulator is informed that the item is being used by the GUI window 'instance' and is thus now in the window's sensitivity list, that is, the simulator is aware that the window should be informed of any change to that item.

During simulation, any activity relating to the item (start/end events, changes in parameter values etc) will cause the relevant GUI windows to be scheduled for update and any display updates made. The information displayed on the window relates directly back to the each item's Time Queue and subsequent Time Queue entries.

By default, while an item is being displayed in the GUI all events in the Time-Q of that item are retained to enable window refresh, and to enable requests for further information to be made through the GUI. Such requests may include requests for parent/child relationships involving the item. The user may require past possibilities and cancelled items to be displayed—and in such circumstance the simulator will retain these entries as well. Such a feature is useful for debugging purposes.

The GUI is directly connected to the internal state of the simulator, and provides a window by which the simulator state can be examined and traversed. State can even be set via the GUI and the simulator can treat the change as if it was done by a unit in the model.

The performance and usability of the dynamic GUI features, such as the sequence display, will be dependent on the number of items that are to be monitored and the period for which they are monitored. The simulator will automatically tidy-up when an item is removed from the displays. In this way the user is in control of the amount of information that is held at any time during simulation. When maximum simulation performance is required rather than maximum debugging capability, the user would remove all items from all dynamic displays.

Figure 13:
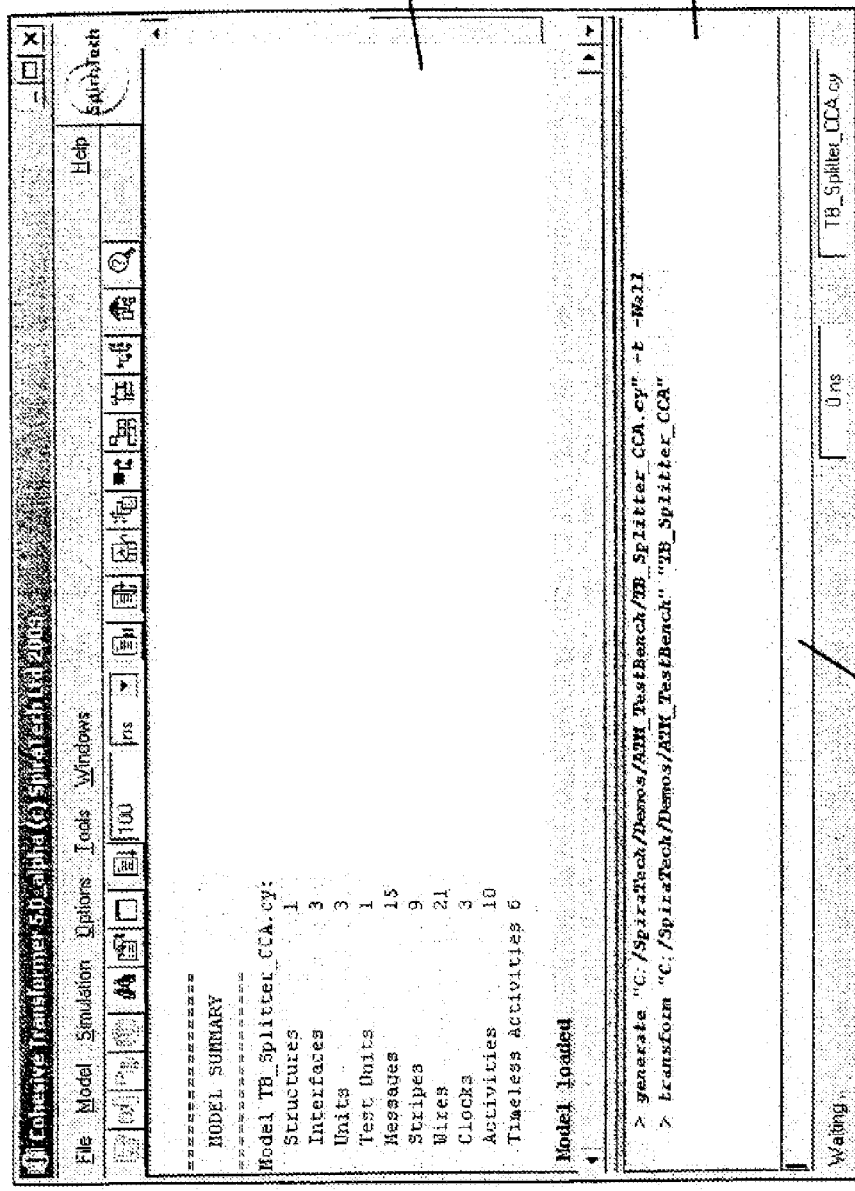
FIGS. 13 to 19 are screenshots of a graphical user interface provided by an embodiment of the present invention.
Figure 14:
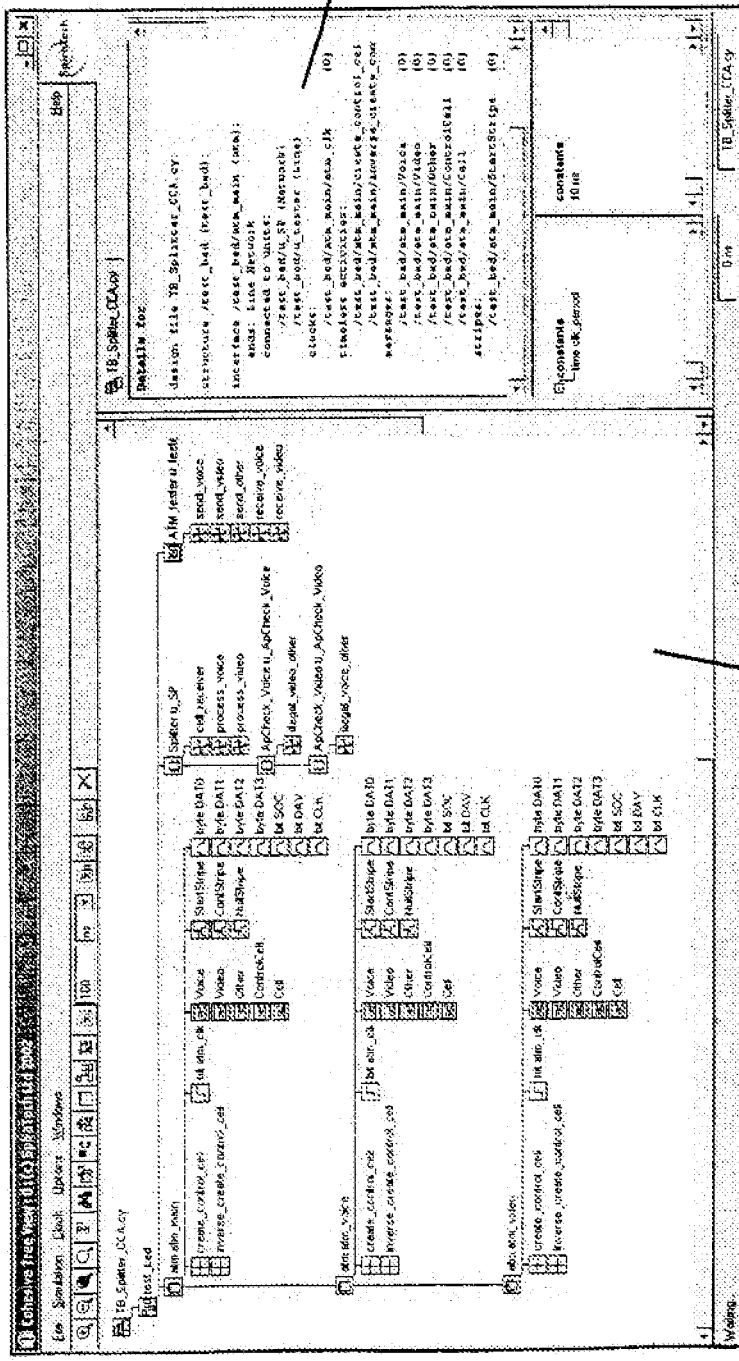

FIG. 13 illustrates a main command window of the GUI. An area 119 shows commands which have been executed, an area 120 shows a summary of the model to be simulated and any textual output, and an area 121 includes a cursor which a used may use to input suitable commands. The main window of FIG. 13 may be used to select and compile a model for simulation. Once compiled, components of the model may be viewed using a TreeView function as shown in FIG. 14. As well as providing details of model structure, the TreeView function allows the current state of the model to be seen in an area 122. Different symbols are used to denote different components within the modelled system. An area 123 shows state associated with selected components of the tree.

Figure 15:
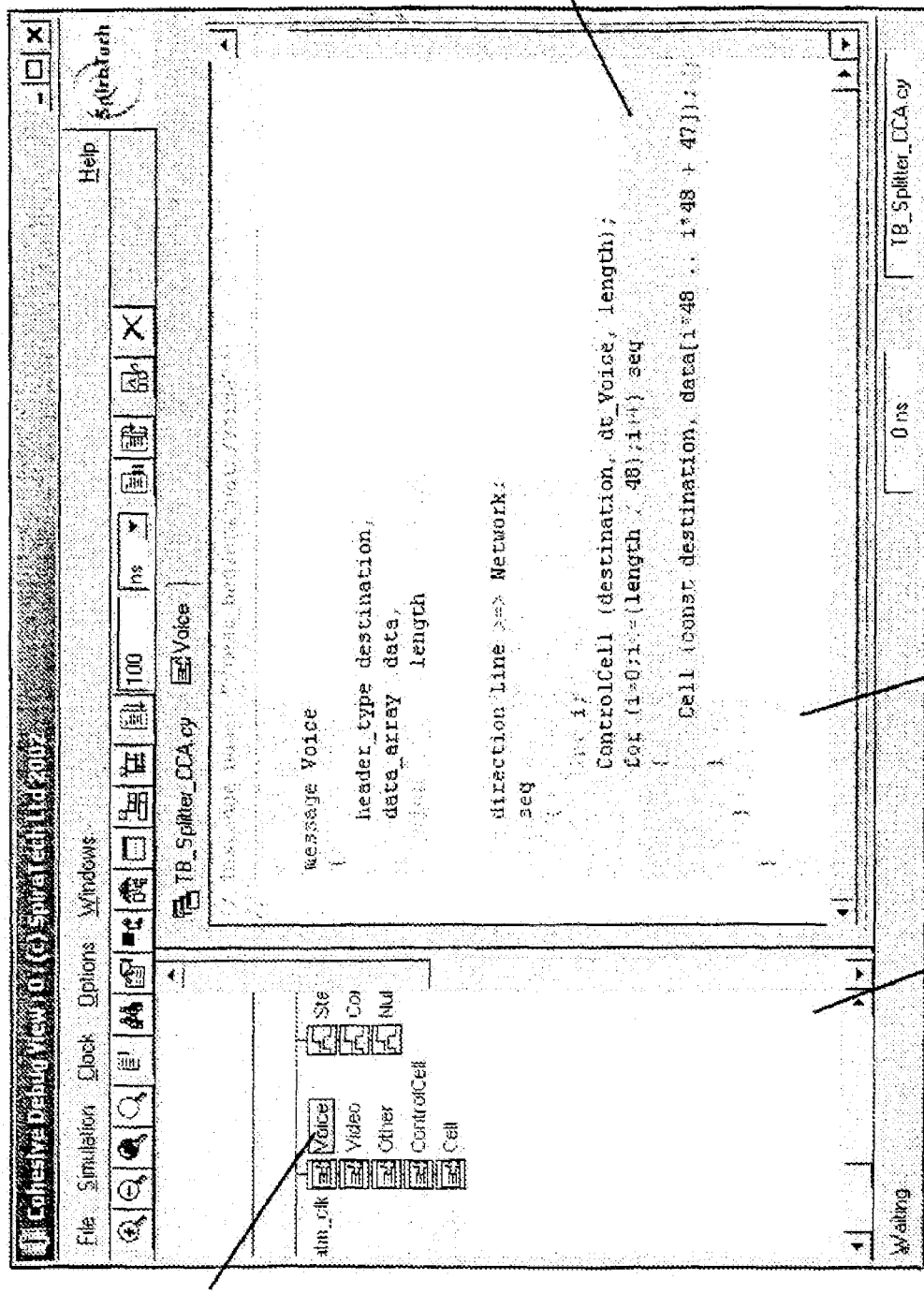

FIG. 15 shows a source Debug View window similar to FIG. 14 in further detail. The model navigation mechanism is shared between many windows. It can be seen from FIG. 15 that an item may be selected in the tree, and corresponding code is then highlighted in the area 91. In FIG. 15, the item voice 124 has been highlighted, and a corresponding block of code 125 has been highlighted in area 123.

Figure 16:
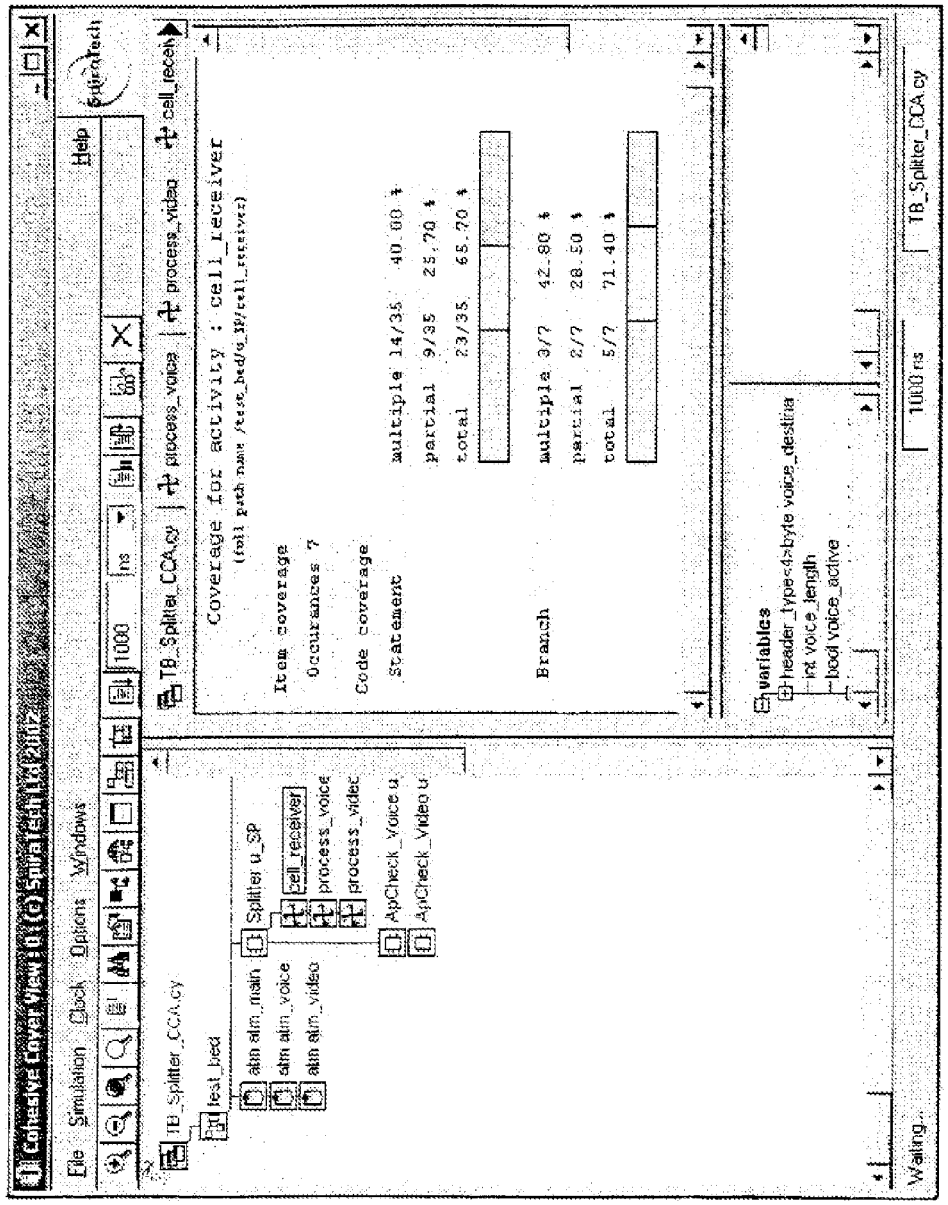

FIG. 16 shows a further feature of the GUI. The GUI may display to the user details of code, data, branch or state coverage, that is, how much a respective entity is used.

Figure 17:
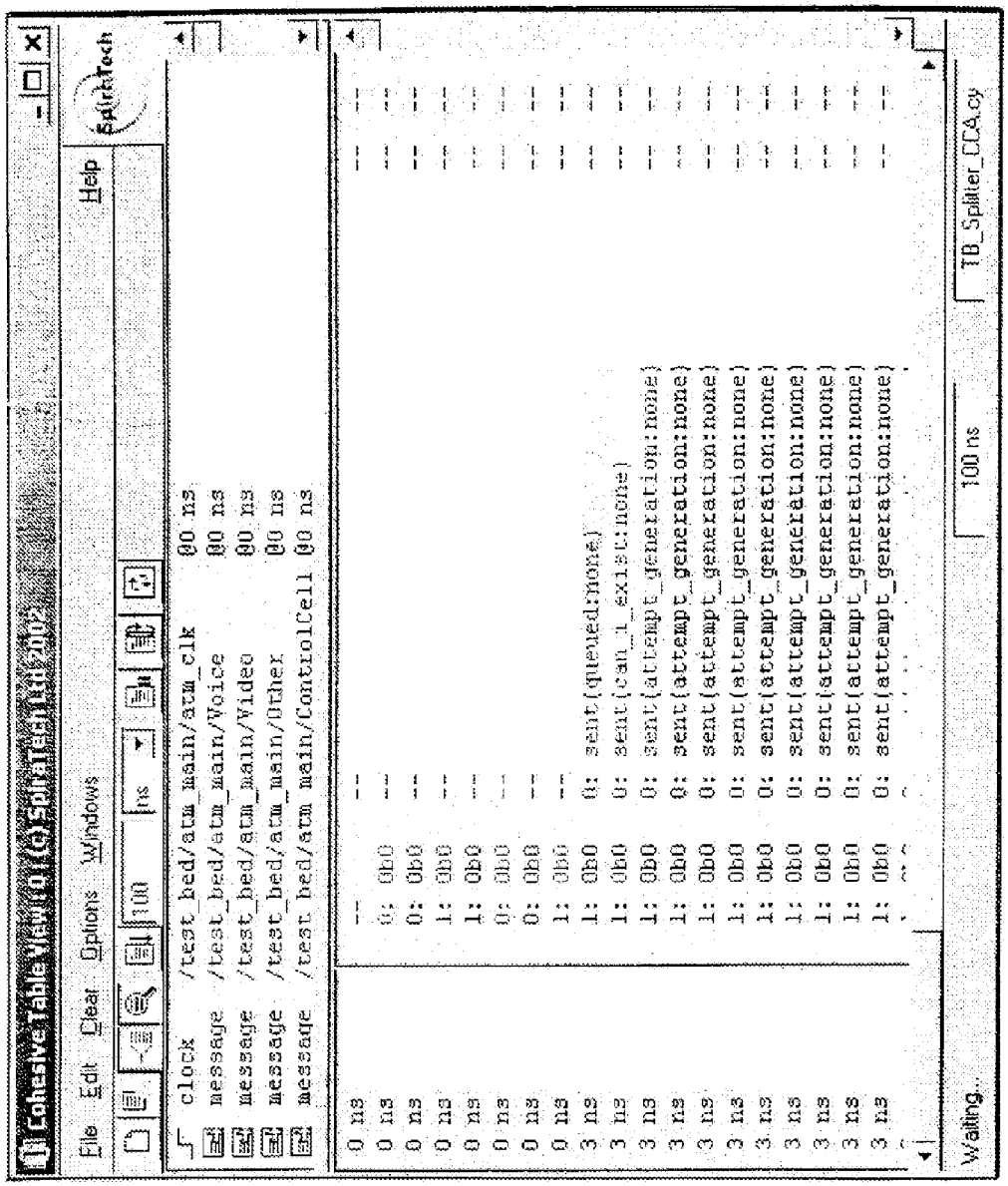

FIG. 17 shows a window which provides a detailed event-by-event view of activity within the simulator for selected items in a tabular format. The output shows the states of items in chronological order. Data shown in FIG. 17 may be exported to other applications in various formats, including a plain text format.

Figure 18:
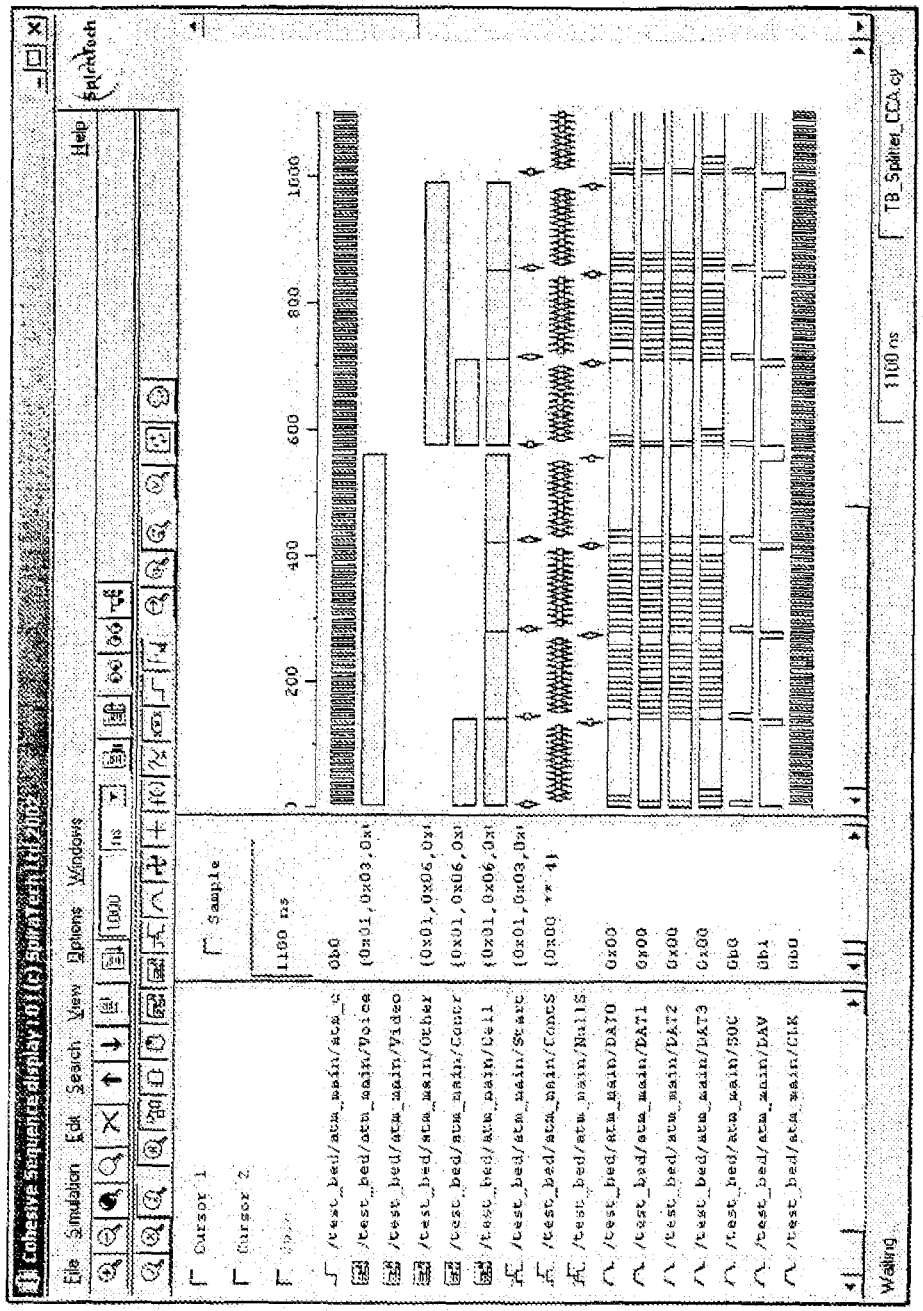

FIG. 18 shows data similar to that shown in FIG. 12, that is data relating to activity of various components within the model. The complete state of any item can be displayed during simulation. The display of FIG. 18 is a window onto the TimeQ and provides details of time events showing historical activity, current status and predicted set of future possibilities. Different colours may be used to signify the status of the event or how the event occurred. For example, red may be used to indicate the message was sent and green may be used to indicate that the message was generated. The rate of update of the window is controlled by the user. For fastest performance the window can be updated only at the end of the simulation run; for improved monitoring the window can be updated on every change. Updating of the GUI is carried out by modelling the GUI as a unit within the modelled system, as described above. Items to be displayed on the display of FIG. 18 may be chosen using a view of the form of FIG. 14.

Figure 19:
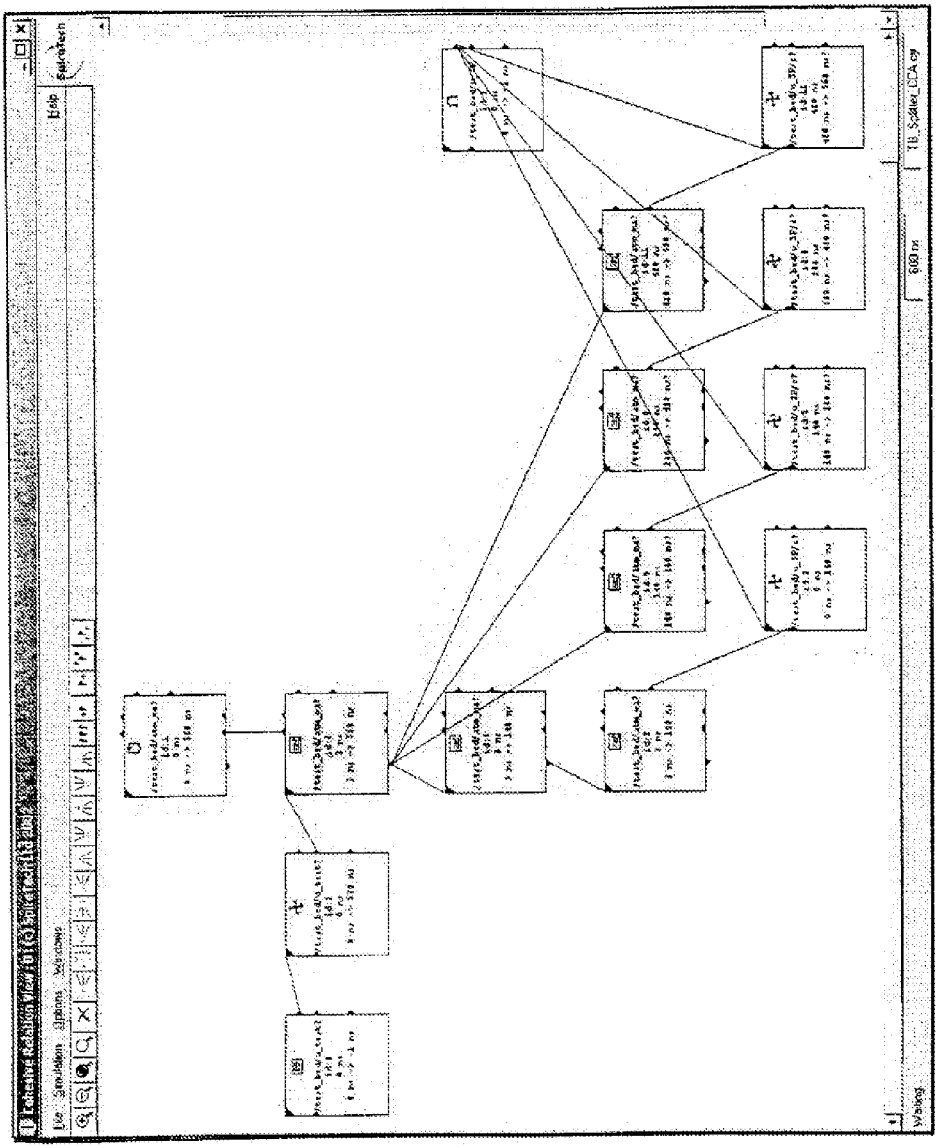

FIG. 19 provides another view of the TimeQ and shows a graph which provides maximum debugging capability of cause and effect of any individual instance's time queue. The window provides a graphical view of relationships between different time queue entries—with the nodes representing an entry, and different kinds of edges (denoted by how they connect to a node) representing the different relationships. For example, the display of FIG. 19 can be used to view what enabled a particular entry, what other entries did a particular entry enable—or recognise or generate. In this way the user can access the full path of 'what caused this entry to occur' and 'what was the effect of this entry occurring'.

We claim:

1. A method for modelling and simulating a system using an event based simulation system, the method comprising:
   storing a plurality of models each representing a component of the system;
   storing current status information for each model;
   generating a plurality of events affecting the current status of at least one model of the plurality of models;
   simulating behaviour of the system by processing the plurality of events affecting the current status of the at least one model;
   adding a first item during simulation to a plurality of items of a sensitivity list of a user interface based on receiving information that a user added the first item to a display window of the user interface, the first item and the plurality of items of the sensitivity list corresponding to status information of respective models;
   storing historical information for the plurality of items of the sensitivity list, the historical information comprising a time queue entry for a respective item of the plurality of items of the sensitivity list, the time queue entry comprising functional relationships and interface relationships of the respective item;
   outputting a graphical view of the time queue entries for the plurality of items of the sensitivity list to the user by the user interface, wherein the user interface is modelled by the event based simulation system as a further component of the system, and the user interface is scheduled for update based on the simulation changing the current status information of any item on the sensitivity list; and
   removing a second item during simulation from the plurality of items of the sensitivity list of the user interface based on receiving information that the user removed the second item from the display window of the user interface.

2. The method according to claim 1, wherein each model comprises a sensitivity list containing a plurality of events, and the method comprises updating the status associated with a model in response to an event contained in its sensitivity list.

3. The method according to claim 2, wherein at least one event in the sensitivity list of the user interface represents updating of another model.

4. The method according to claim 1, wherein the user interface is a graphical user interface.

5. The method according to claim 4, further comprising, by the graphical user interface, changing a state of the event based simulation system; and
   by the event based simulation system, treating the changing of the state of the event based simulation system as having been done by a component of the system.

6. The method according to claim 1, wherein the plurality of events are within an event queue and the processing of the plurality of events comprises, for a given time period, processing the plurality of events in an order.

7. The method according to claim 1, wherein the functional relationships of the time queue entry of the respective item comprise an initiator of the respective item, any items called by the respective item, sent interface items, and received interface items.

8. The method according to claim 1, wherein the interface relationships of the time queue entry of the respective item comprise consumers, enabling parents, and enabled children of the respective item.

9. A computer readable storage device storing computer executable instructions for causing a computer to perform a method for modelling and simulating a system using an event based simulation system, the method comprising:
   storing a plurality of models each representing a component of the system;
   storing current status information for each model;
   generating a plurality of events affecting the current status of at least one model of the plurality of models;
   simulating behaviour of the system by processing the plurality of events affecting the current status of the at least one model;
   during simulation, adding a first item to a plurality of items of a sensitivity list of a user interface based on receiving information that a user added the first item to a display window of the user interface, the first item and the plurality of items of the sensitivity list corresponding to status information of respective models;
   storing historical information for the plurality of items of the sensitivity list, the historical information comprising a time queue entry for a respective item of the plurality of items of the sensitivity list, the time queue entry comprising functional relationships and interface relationships of the respective item; and
   outputting a graph of the time queue entries for the plurality of items of the sensitivity list to the user by the user interface, wherein the user interface is modelled by the event based simulation system as a further component of the system, and the user interface is scheduled for update based on the simulation changing the current status information of any item on the sensitivity list.

10. The computer readable storage device of claim 9, wherein each model comprises a sensitivity list containing a plurality of events, and the method further comprises updating the status associated with a model in response to an event contained in its sensitivity list.

11. The computer readable storage device of claim 9, wherein at least one event in the sensitivity list of the user interface represents updating of another model.

12. The computer readable storage device of claim 9, wherein the user interface is a graphical user interface.

13. The computer readable storage device of claim 12, the method further comprising, by the graphical user interface, changing a state of the event based simulation system; and
   by the event based simulation system, treating the changing of the state of the event based simulation system as having been done by a component of the system.

14. The computer readable storage device of claim 9, wherein the plurality of events are within an event queue and wherein the processing of the plurality of events comprises, for a given time period, processing the plurality of events in an order.

15. The computer readable storage device of claim 9, wherein the functional relationships of the time queue entry of the respective item comprise an initiator of the respective item, any items called by the respective item, sent interface items, and received interface items.

16. The computer readable storage device of claim 9, wherein the interface relationships of the time queue entry of the respective item comprise consumers, enabling parents, and enabled children of the respective item.

17. A method for modelling and simulating a system using an event based simulation system comprising:

storing a plurality of models each representing a respective component of the system;

storing current status information for each model of the plurality of models;

generating a plurality of events affecting the current status of at least one model of the plurality of models;

simulating behaviour of the system by processing the plurality of events affecting the current status of the at least one model;

during simulation, adding a first item to a plurality of items of a sensitivity list of a graphical user interface based on receiving information that a user added the first item to a display window of the graphical user interface, the first item and the plurality of items of the sensitivity list corresponding to status information of respective models;

storing historical information for the plurality of items of the sensitivity list, the historical information comprising a time queue entry for a respective item of the sensitivity list, the time queue entry comprising functional relationships and interface relationships of the respective item;

outputting a view of the time queue entries for the plurality of items of the sensitivity list to the user by the graphical user interface, wherein the graphical user interface is modelled by the event based simulation system as a further component of the system, and the graphical user interface is scheduled for update based on the simulation changing the current status information of any item on the sensitivity list;

during simulation, removing a second item from the sensitivity list of the graphical user interface based on receiving information that the user removed the second item from the display window of the graphical user interface;

changing a state of the event based simulation system based on receiving user input from the graphical user interface; and by the event based simulation system, treating the changing of the state of the event based simulation system as having been done by a component of the system.

18. The method of claim 17, wherein the functional relationships of the time queue entry of the respective item comprise an initiator of the respective item, any items called by the respective item, sent interface items, and received interface items.

19. The method of claim 17, wherein the interface relationships of the time queue entry of the respective item comprise consumers, enabling parents, and enabled children of the respective item.

* * * * *